(12) United States Patent
Shiratake

(10) Patent No.: US 7,709,324 B2
(45) Date of Patent: May 4, 2010

(54) METHOD FOR FORMING A GATE WITHIN A TRENCH INCLUDING THE USE OF A PROTECTIVE FILM

(75) Inventor: Shigeru Shiratake, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 288 days.

(21) Appl. No.: 11/544,616

(22) Filed: Oct. 10, 2006

(65) Prior Publication Data
US 2007/0082440 A1 Apr. 12, 2007

(30) Foreign Application Priority Data
Oct. 11, 2005 (JP) .............. 2005-296079
Aug. 25, 2006 (JP) .............. 2006-228554

(51) Int. Cl.
*H01L 21/336* (2006.01)
*H01L 21/3205* (2006.01)
*H01L 21/4763* (2006.01)

(52) U.S. Cl. ............... 438/259; 438/592; 257/E27.091; 257/E21.655

(58) Field of Classification Search ............ 438/259, 438/270, 592; 257/E21.655, E27.091
See application file for complete search history.

(56) References Cited

U.S. PATENT DOCUMENTS 7,226,840 B2* 6/2007 Chindalore et al. ......... 438/270

2001/0025973 A1* 10/2001 Yamada et al. .............. 257/296
2001/0044193 A1* 11/2001 Lane et al. .................. 438/424
2004/0253801 A1* 12/2004 Lin ............................ 438/612
2005/0082609 A1* 4/2005 Inagawa et al. ............. 257/332
2006/0118879 A1* 6/2006 Li ............................. 257/369

FOREIGN PATENT DOCUMENTS

| JP | 7-66297 | 3/1995 |
| JP | 9-232535 | 9/1997 |
| JP | 2001-210801 | 8/2001 |
| JP | 2004-14696 | 1/2004 |
| JP | 2005-142203 | 6/2005 |

* cited by examiner

*Primary Examiner*—Matthew C Landau
*Assistant Examiner*—Daniel Luke
(74) *Attorney, Agent, or Firm*—McDermott Will & Emery LLP

(57) ABSTRACT

Gate trenches 108 are formed in a memory cell region M using a silicon nitride film 103 as a mask in a state in which the semiconductor substrate 100 in a P-type peripheral circuit region P and an N-type peripheral circuit region N is covered by a gate insulating film 101s, a protective film 102, and the silicon nitride film 103. A gate insulating film 109 is then formed on the inner walls of the gate trenches 108, and a silicon film 110 that includes an N-type impurity is embedded in the gate trenches 108. The silicon nitride film 103 is then removed, and a non-doped silicon film is formed on the entire surface, after which a P-type impurity is introduced into the non-doped silicon film on region P, and an N-type impurity is introduced into the non-doped silicon film on regions M and N.

7 Claims, 24 Drawing Sheets

METHOD FOR FORMING A GATE WITHIN A TRENCH INCLUDING THE USE OF A PROTECTIVE FILM

TECHNICAL FIELD

The present invention relates to a semiconductor device and to a method for manufacturing the same, and particularly relates to a semiconductor device and a method for manufacturing a semiconductor device having both a trench-gate transistor and a dual-gate transistor.

BACKGROUND OF THE INVENTION

The recent miniaturization of DRAM (Dynamic Random Access Memory) cells has been accompanied by the necessity of shortening the gate length of memory cell transistors. However, short channel effects in a transistor become more severe as the gate length is shortened, and drawbacks occur whereby sub-threshold current increases. When the substrate impurity concentration is increased in order to minimize this effect, deterioration of the refresh characteristics in the DRAM is a severe drawback because of increased junction leakage.

A so-called trench-gate transistor (also referred to as a recess-channel transistor) in which a gate electrode is embedded in a groove formed on a silicon substrate has been emphasized as a means of overcoming these drawbacks (see Japanese Laid-open Patent Application Nos. H9-232535, 2001-210801, 2005-142203, H7-066297, and 2004-014696). Using a trench-gate transistor, the effective channel length (gate length) can be physically and adequately maintained, and it is possible to create precision DRAM having a minimum feature size of 90 nm or less.

It has become necessary to employ transistors having a dual-gate structure in the peripheral circuit region of DRAM in order to provide increased performance and reduced drive voltage in a device. In a dual-gate structure, a gate electrode that includes N-type polycrystalline silicon, into which an N-type impurity (phosphorus or the like) is introduced, is used as the gate electrode of an N-channel transistor, and a gate electrode that includes P-type polycrystalline silicon, into which a P-type impurity (boron or the like) is introduced, is used in a P-channel transistor.

However, such drawbacks as the following occur when transistors having the two structures described above are used jointly in a single semiconductor device. Specifically, the following drawbacks occur when a trench-gate transistor is formed in the memory cell region, and a dual-gate transistor is formed in the peripheral circuit region.

The general method for forming the gate electrodes of a trench-gate transistor and a dual-gate transistor will first be described.

A gate electrode in a trench-gate transistor is formed by a process in which a groove (gate trench) is formed in a semiconductor substrate, and a gate insulating film is formed on the inner wall of the gate trench, after which a doped silicon film as a gate electrode material is embedded in the gate trench.

On the other hand, the gate electrode of a dual-gate transistor is formed by a method in which a non-doped silicon film is formed on a gate insulating film that is formed on a semiconductor substrate, after which a region in which an N-channel transistor is formed is covered by a resist mask, and a P-type impurity is introduced into a region for forming a P-channel transistor. The region in which the P-channel transistor is formed is then covered by a resist mask, and an N-type impurity is introduced into the region in which the N-channel transistor is formed, after which the P-type silicon film and N-type silicon film are patterned in the shape of a gate electrode.

Accordingly, two methods of the type described below may be used to form a trench-gate transistor in a memory cell region and to form a dual-gate transistor in a peripheral circuit region. These two methods will be described using FIGS. 21 through 27 below. In FIGS. 21 through 27, "region M" indicates the memory cell region, and "region P" and "region N" are provided to the peripheral circuit region, wherein "region P" is a region in which a P-channel transistor provided with a gate electrode that includes P-type polycrystalline silicon is formed, and "region N" is a region in which an N-channel transistor provided with a gate electrode that includes N-type polycrystalline silicon is formed.

The first method (hereinafter referred to as the first conventional method) will be described using FIGS. 21 through 24.

As shown in FIG. 21, a gate trench 202 is first formed in region M of a semiconductor substrate 200 whose regions are separated by an STI (Shallow Trench Isolation) 201, and a gate insulating film 203 is then formed on the entire surface that includes the inner wall of the gate trench 202. A non-doped silicon film 204 is then formed on the entire surface that includes the inside of the gate trench 202, as shown in FIG. 22. As shown in FIG. 23, regions M and N are then covered by a resist mask 205, a P-type impurity (boron, for example) is ion-implanted into region P, and the resist mask 205 is removed. Then, region P is covered by a resist mask 206, and an N-type impurity (phosphorus, for example) is ion-implanted into regions M and N, as shown in FIG. 24. The silicon films 204 of each region are then patterned into the shape of a gate electrode.

However, in this first conventional method, when ion implantation is performed according to the thickness (depth) of the silicon film 204 on region N in the process shown in FIG. 24, the silicon film 204 inside the gate trench 202 cannot be adequately doped with the N-type impurity, the trench-gate electrode becomes depleted, and it becomes impossible to demonstrate adequate performance in a memory cell transistor. Conversely, when the N-type impurity is ion-implanted according to the depth of the gate trench 202, the impurity cannot be introduced at a suitable concentration into the silicon film 204 on region N, and the impurity is introduced into the silicon substrate 200 in which the channel region and source/drain region are formed. There is therefore an adverse effect on the operation of both the memory cell transistor formed in region M and the transistor formed in region N.

Another method (hereinafter referred to as the second conventional method) such as the one described below may be used to prevent the type of drawbacks encountered in the first conventional method.

After a gate trench 202 and a gate insulating film 203 are first formed in the same manner as shown in FIG. 21, an impurity-doped silicon film (doped silicon film) 304a is formed on the entire surface that includes the inside of the gate trench 202, as shown in FIG. 25. As shown in FIG. 26, the entire surface is then etched back so as to leave the doped silicon film 304a only in the gate trench 202. A non-doped silicon film 304b is then formed on the entire surface, as shown in FIG. 27, and impurities are ion-implanted into the non-doped silicon film 304b in the same manner as in FIGS. 23 and 24.

According to this method, the doped silicon film 304a is embedded in the gate trench 202, and the problem of depletion of the trench-gate electrode is therefore overcome. Ion implantation can also be performed appropriately according to the thickness of the non-doped silicon film 304b when impurities are ion implanted in the same manner as in FIGS. 23 and 24, and it is possible to prevent impurities from being introduced into the silicon substrate 200.

However, the drawbacks that occur in the second conventional method are different from those of the first conventional method. Specifically, etching back the entire surface as shown in FIG. 26 causes the gate insulating film 203 to be damaged. A heat treatment and an oxidation process must be performed in order to repair the damage to the gate insulating film 203. A high-resistance layer is therefore formed on the surface of the doped silicon film 304a following the etch-back shown in FIG. 26. Because the high-resistance layer intervenes between the doped silicon film 304a and the non-doped silicon film 304b, the gate resistance increases.

SUMMARY OF THE INVENTION

The present invention was developed in order to overcome the drawbacks described above, and an object of the present invention is to provide a semiconductor device and a method for manufacturing a semiconductor device whereby both transistors can be endowed with high performance when both a trench-gate transistor and a dual-gate transistor are formed on the same semiconductor substrate.

The above and other objects of the present invention can be accomplished by a method for manufacturing a semiconductor device, comprising:

a first step for forming a first gate insulating film on a memory cell region and a peripheral circuit region which has a first conductivity type transistor formation region and a second conductivity type transistor formation region of a semiconductor substrate;

a second step for forming a protective film on said first gate insulating film;

a third step for forming a mask layer that is provided with an opening used to form a gate trench;

a fourth step for forming a gate trench in said memory cell region of said semiconductor substrate using said mask layer;

a fifth step for forming a second gate insulating film in an inner wall of said gate trench;

a sixth step for forming in said gate trench a first silicon film that is doped with a second conductivity type impurity;

a seventh step for removing said mask layer;

an eighth step for forming a non-doped second silicon film on said protective film and on said first silicon film;

a ninth step for selectively introducing a first conductivity type impurity into said second silicon film on said first conductivity type transistor formation region of said peripheral circuit region;

a tenth step for selectively introducing a second conductivity type impurity into said second silicon film on said second conductivity type transistor formation region of said peripheral circuit region; and an eleventh step for patterning said second silicon film and said protective film, forming a first gate electrode that includes said second silicon film into which said first conductivity type impurity is introduced, and forming a second gate electrode that includes said second silicon film into which said second conductivity type impurity is introduced.

Any type of film may be used as the protective film insofar as the film (conductive thin film or the like, for example) does not impede the operation of the first and second conductivity type transistors, but the use of a non-doped silicon film is particularly preferred. Impurities are thereby introduced also into the non-doped silicon film that is the protective film, and the layered film that includes the protective film and the second silicon film can be caused to function as a gate electrode when the impurities are introduced into the non-doped second silicon film.

The above and other objects of the present invention can also be accomplished by a semiconductor device comprising:

a semiconductor substrate having a memory cell region, a P-type peripheral circuit region, and an N-type peripheral circuit region;

a trench-gate transistor formed in said memory cell region;

a planar P-channel transistor disposed in said P-type peripheral circuit region and provided with a P-type gate electrode that includes P-type polycrystalline silicon formed on said semiconductor substrate via a first gate insulating film; and a planar N-channel transistor disposed said N-type peripheral circuit region and provided with an N-type gate electrode that includes N-type polycrystalline silicon formed on said semiconductor substrate via a first gate insulating film; wherein said P-type gate electrode includes a conductive thin film and a first silicon film formed on said conductive thin film;

said N-type gate electrode includes said conductive thin film and a second silicon film formed on said conductive thin film; and a gate electrode of said trench-gate transistor includes a second gate insulating film formed on an inner wall of a gate trench that is provided to said semiconductor substrate, and a third silicon film that is formed in said gate trench via said second gate insulating film.

According to the present invention, the first insulating film of the peripheral circuit region is protected by a protective film (conductive thin film) made from a non-doped silicon film or the like when the mask layer used to form the gate trench is removed after an impurity-doped first silicon film is formed in the gate trench. Damage to the first gate insulating film can therefore be prevented, and it is possible to embed an impurity-doped first silicon film into the gate trench, to form a second silicon film first in a non-doped state as the silicon film to be the gate electrode in the peripheral circuit region, and then to perform doping of each type of impurity to create silicon films of each conductivity type. Accordingly, even when a trench-gate transistor and a transistor that has a dual-gate structure are simultaneously formed on the same semiconductor substrate, it is possible to obtain high performance in both transistors.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

FIGS. 1 through 20 are schematic views showing the process for manufacturing a semiconductor device that has a trench-gate transistor and a dual-gate-structured transistor according to an embodiment of the present invention. In FIGS. 1 through 20, "region M" indicates the memory cell region in which the trench-gate transistor is formed, and "region P" and "region N" are provided to the peripheral circuit region, wherein "region P" is a region (also referred to as a P-type peripheral circuit region) in which a planar P-channel transistor provided with a gate electrode that includes P-type polycrystalline silicon is formed, and "region N" is a region (also referred to as an N-type peripheral circuit region) in which a planar N-channel transistor provided with a gate electrode that includes N-type polycrystalline silicon is formed.

Figure 1:
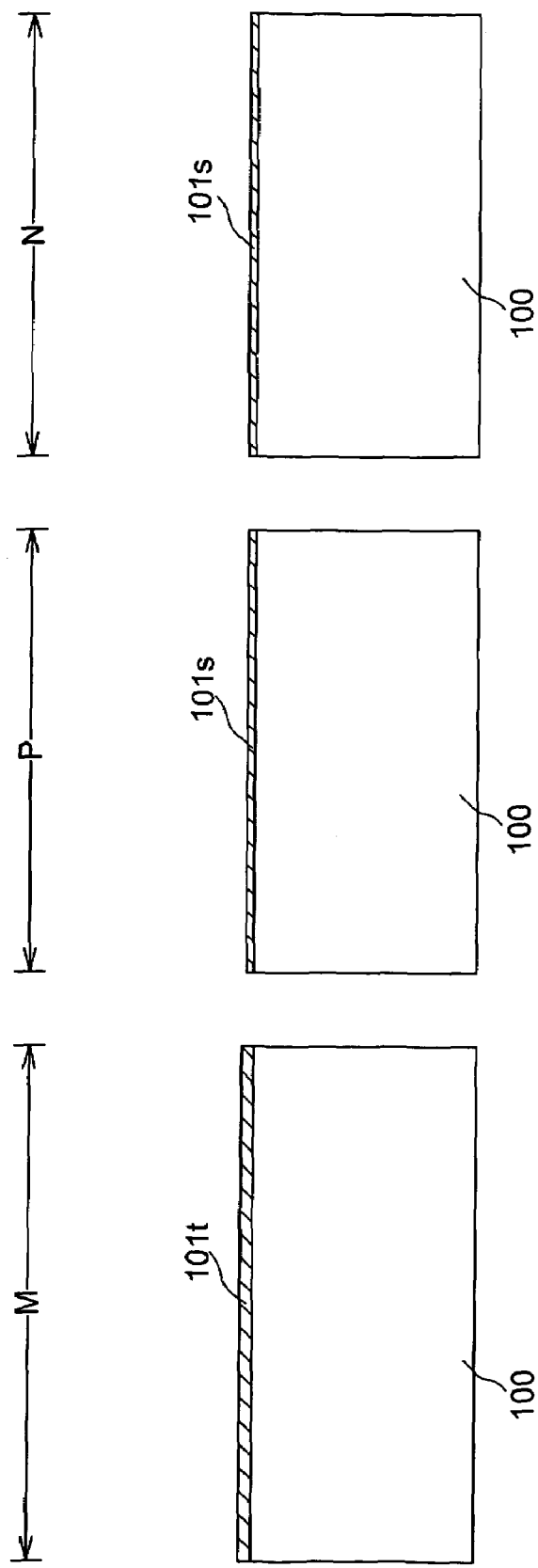
FIG. 1 is a process diagram showing a process of forming a thin oxide film and a thick oxide film that is a part of the manufacturing method of a semiconductor device according to a preferred embodiment of the present invention.

First, a thin oxide film 101s having a thickness of approximately 1.5 to 3 nm is formed on the surface of regions P and N of a semiconductor substrate 100, as shown in FIG. 1. A thick oxide film 101t having a thickness of approximately 4.5 to 6 nm is also formed in region M and in a region (not shown) in which a power supply circuit and the like are formed, and which is a region other than region P or N of the peripheral circuit region. In a specific example, a thermal oxide film having a thickness of slightly less than 6 nm is formed on the entire surface of the semiconductor substrate 100 by thermal oxidation, the region other than regions P and N is covered by a resist mask, and the thermal oxide film on regions P and N is removed, after which the resist mask is removed, and the entire surface of the substrate 100 is cleaned with an acid. This cleaning removes a portion of the surface of the thermal oxide film on region M and on the region (not shown) in which a power supply circuit and the like are formed, and the thickness of the thermal oxide film is reduced to about 5 nm. Then, the entire surface is again thermal-oxidized to form a thin oxide film 101s having a thickness of about 3 nm on regions P and N, and a thick oxide film 101t having a thickness of about 6 nm on region M and the region (not shown) in which a power supply circuit and the like are formed.

The reason for forming oxide films that have different thicknesses is as follows. First, the transistor formed in regions P and N requires a thin gate insulating film in order to operate at low voltage, and the thin oxide film 101s is therefore used as the gate insulating film. In the memory cell transistor formed in region M, a boost voltage is applied, and the power supply circuit also requires gate insulating films that have high voltage resistance, since a high voltage is also applied to a transistor that is used to generate the high voltage required to operate the memory cell. Thick oxide films 101t are therefore formed as these gate insulating films.

Figure 2:
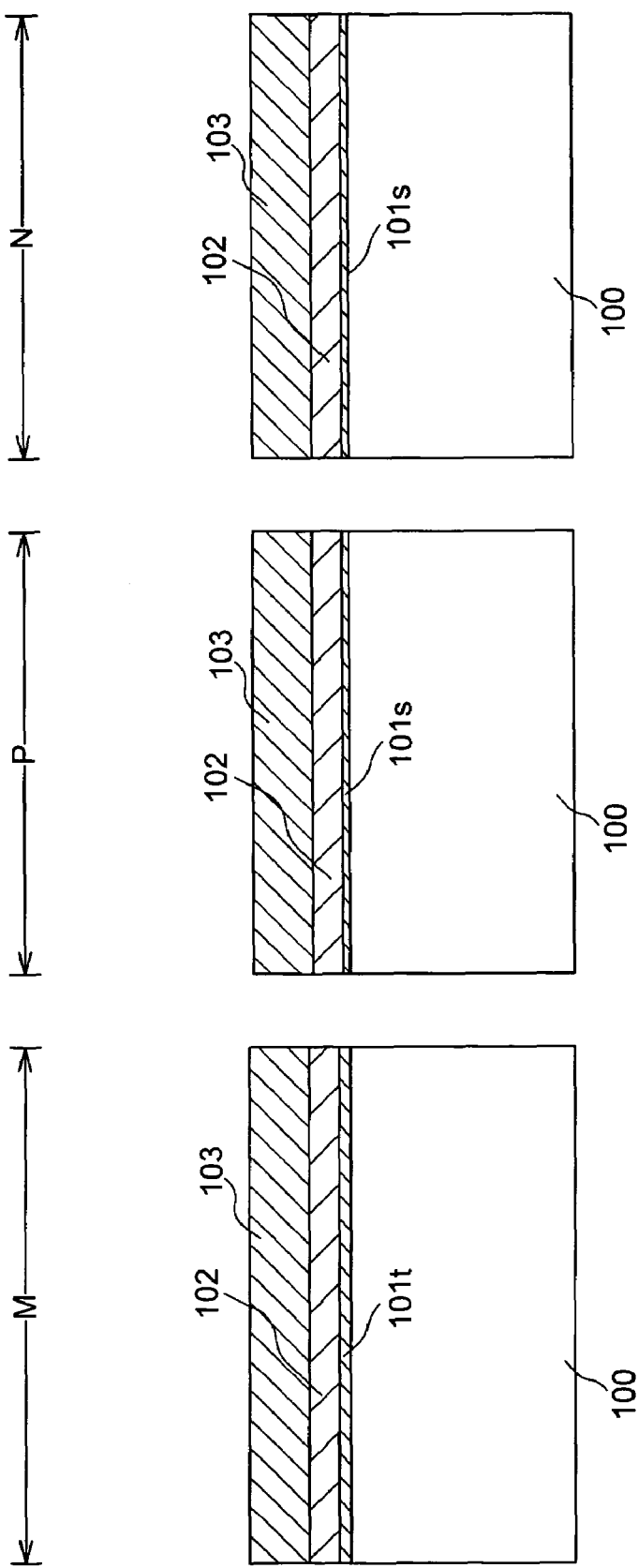
FIG. 2 is a process diagram showing a process of forming a non-doped amorphous silicon film and a silicon nitride film that is a part of the manufacturing method of a semiconductor device according to a preferred embodiment of the present invention.

In the subsequent step as shown in FIG. 2, a non-doped amorphous silicon film 102 as a protective film that has a thickness of approximately 10 to 30 nm is then formed by a CVD (Chemical Vapor Deposition) method in order to protect the thin oxide film 101s. A silicon nitride film 103 having a thickness of approximately 80 to 150 nm is then formed by an LP (Low Pressure)-CVD method.

Figure 3:
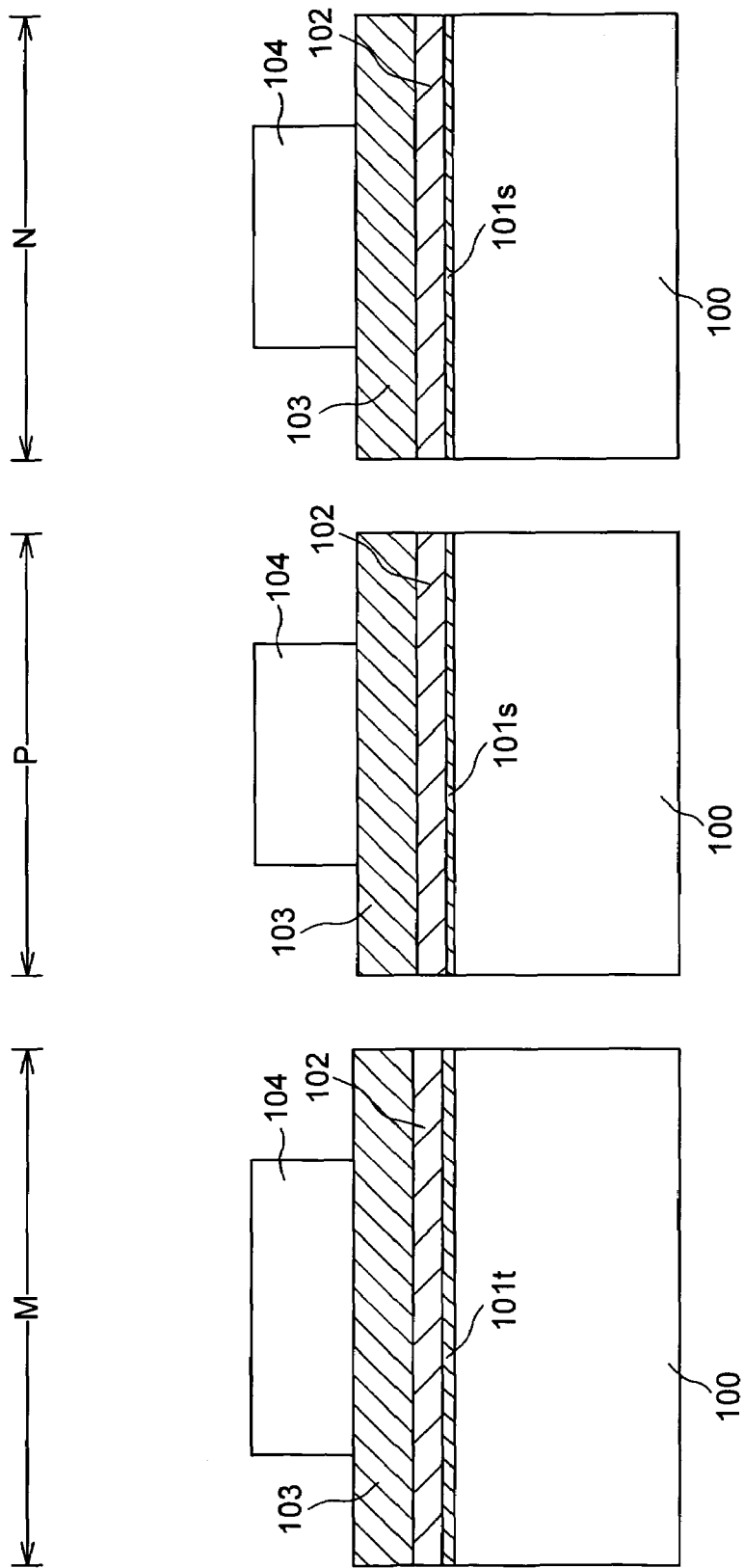
FIG. 3 is a process diagram showing a process of forming a resist pattern that is a part of the manufacturing method of a semiconductor device according to a preferred embodiment of the present invention.

As shown in FIG. 3, a resist pattern 104 is formed on each element separation region formed as a region for separating elements according to the STI (Shallow Trench Isolation) technique.

Figure 4:
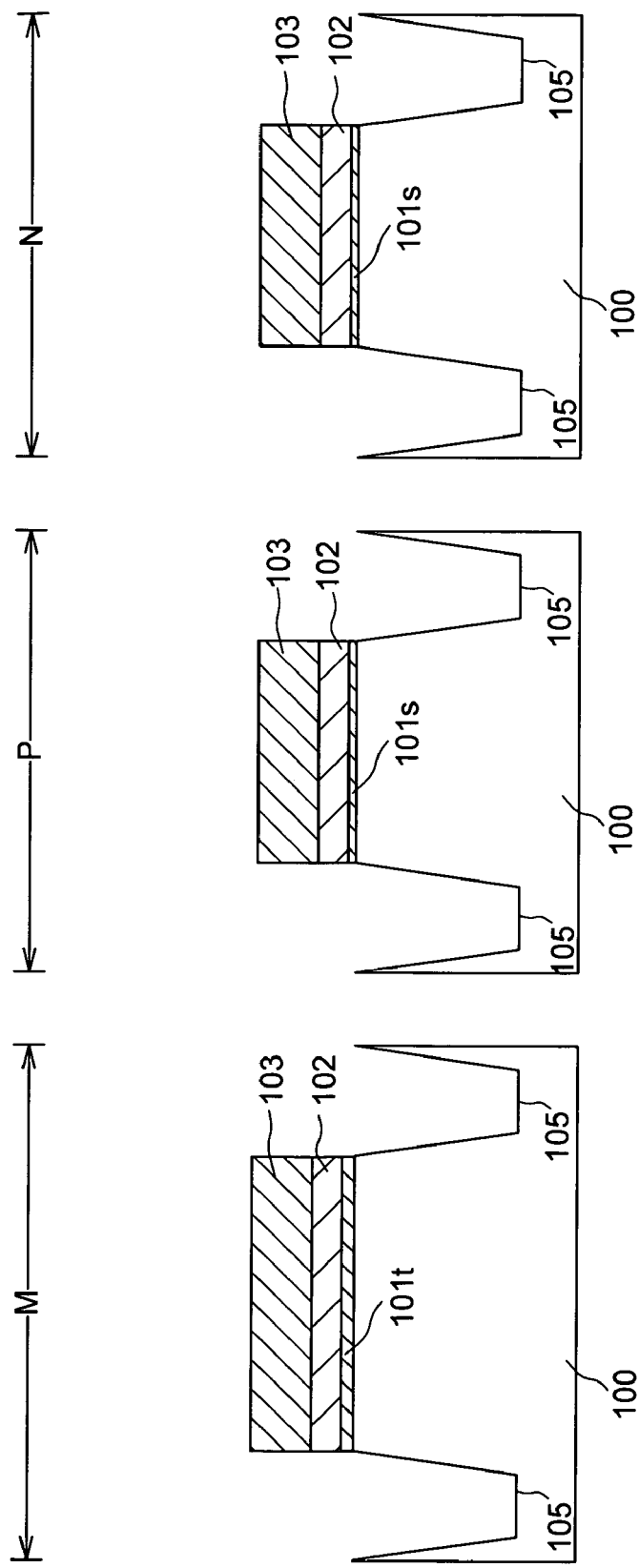
FIG. 4 is a process diagram showing a process of forming a trench used for STI that is a part of the manufacturing method of a semiconductor device according to a preferred embodiment of the present invention.

As shown in FIG. 4, after the silicon nitride films 103 are patterned using the resist patterns 104 as a mask, and the resist patterns 104 are then removed, the non-doped amorphous silicon films 102, the thick oxide films 101t, the thin oxide films 101s, and the semiconductor substrate 100 are dry-etched using the patterned silicon nitride films 103 as masks. The non-doped amorphous silicon films 102, the thick oxide films 101t, and the thin oxide films 101s are thereby patterned, and trenches 105 used for STI are also formed in the semiconductor substrate 100.

Figure 5:
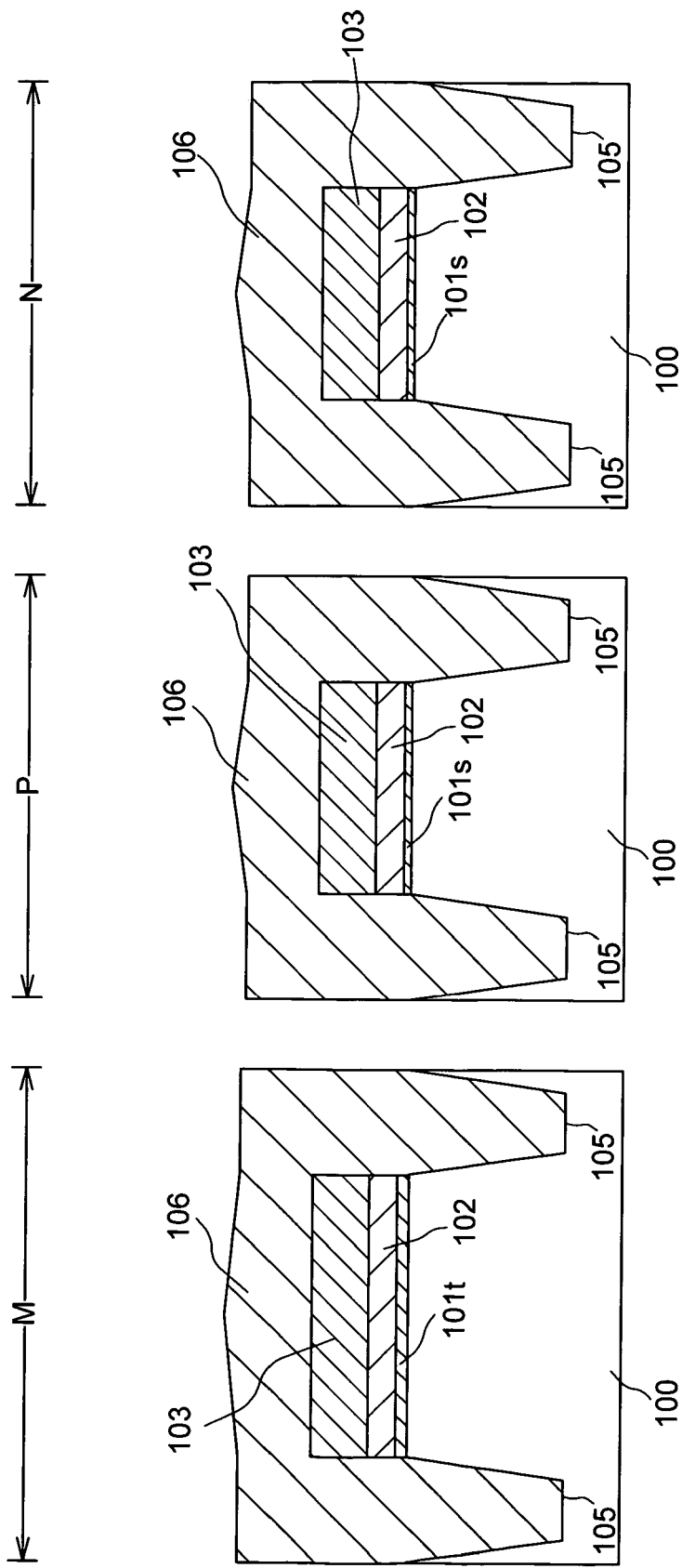
FIG. 5 is a process diagram showing a process of forming silicon oxide films that is a part of the manufacturing method of a semiconductor device according to a preferred embodiment of the present invention.

A thermal oxidation treatment is then performed in order to remove the etching damage from the inner walls of the trenches 105, after which silicon oxide films 106 are formed on the entire surface by an HDP (High-Density Plasma)-CVD method so as to fill in the trenches 105, as shown in FIG. 5.

Figure 6:
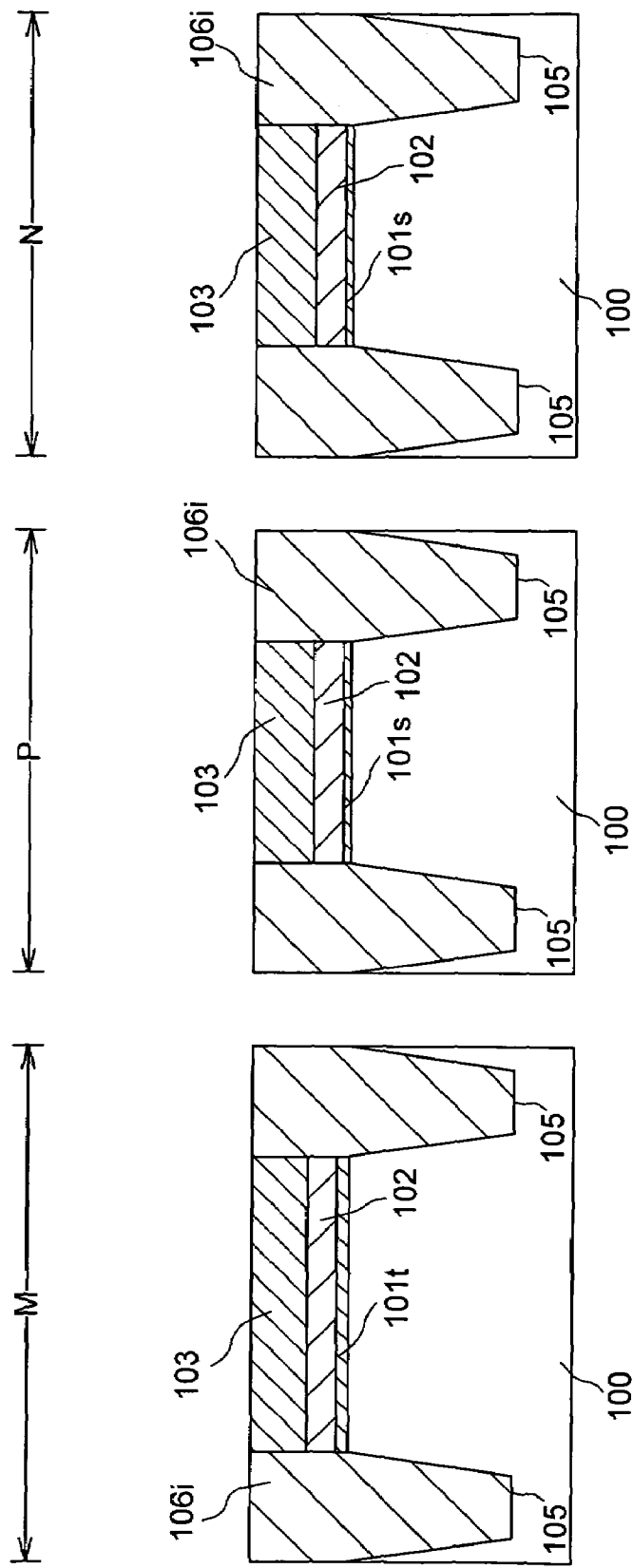
FIG. 6 is a process diagram showing a process of forming element separation regions that is a part of the manufacturing method of a semiconductor device according to a preferred embodiment of the present invention.

CMP (Chemical Mechanical Polishing) is then performed using the silicon nitride films 103 as a stopper, the silicon oxide films 106 on the silicon nitride films 103 are removed by polishing so that the silicon oxide films 106 remain in the trenches 105. Element separation regions 106i are thereby formed, as shown in FIG. 6.

Figure 7:
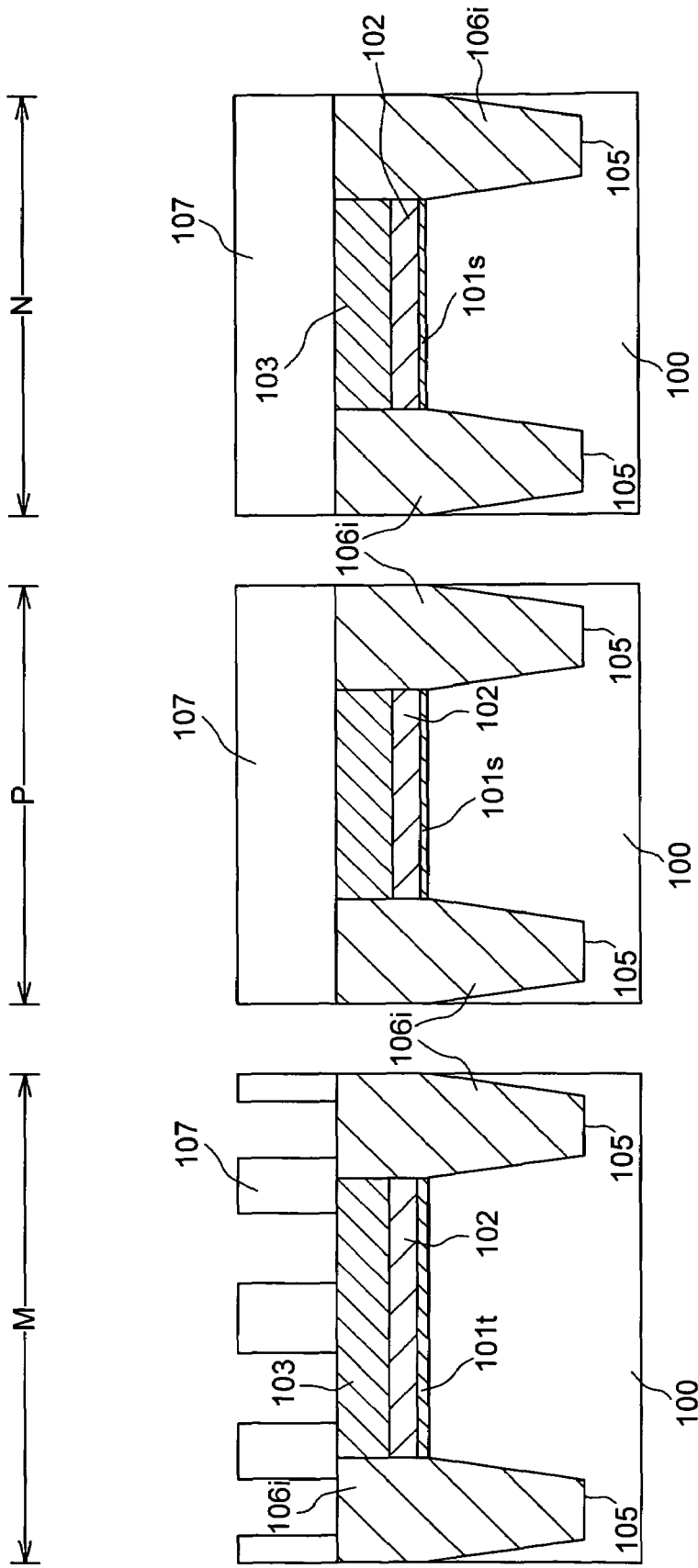
FIG. 7 is a process diagram showing a process of forming a resist pattern that is a part of the manufacturing method of a semiconductor device according to a preferred embodiment of the present invention.

As shown in FIG. 7, a resist pattern 107 that is provided with a plurality of openings is then formed on region M in order to form the gate trenches of the trench-gate memory cell transistor in region M. Regions P and N are completely covered at this time by resist patterns 107. Openings are also formed in the resist pattern 107 above the element separation regions 106i of region M in order to be used for a gate trench that is formed in an adjacent memory cell region (not shown).

Figure 8:
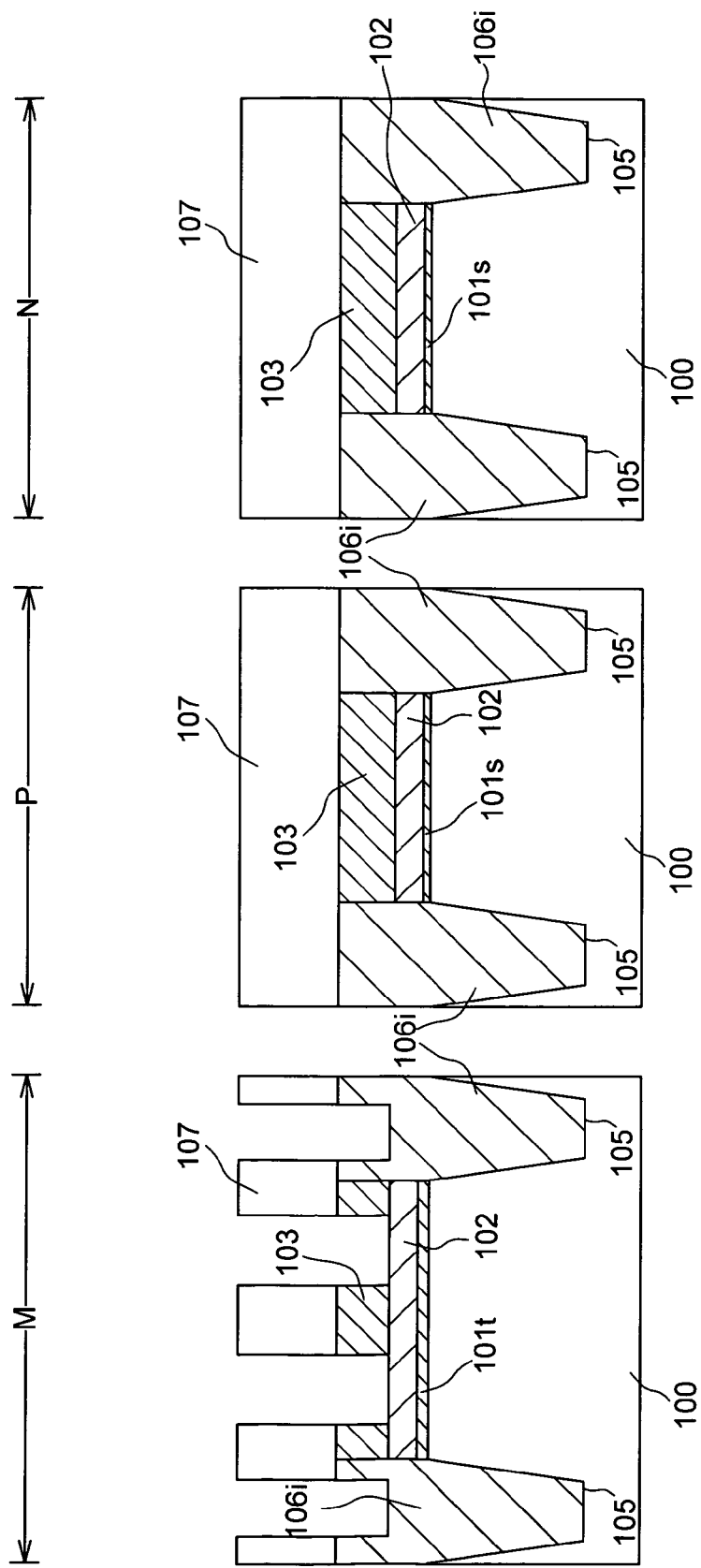
FIG. 8 is a process diagram showing a process of patterning a silicon nitride film that is a part of the manufacturing method of a semiconductor device according to a preferred embodiment of the present invention.

Using the resist pattern 107 as a mask, the silicon nitride film 103 is then patterned in the shape of the mask, as shown in FIG. 8.

Figure 9:
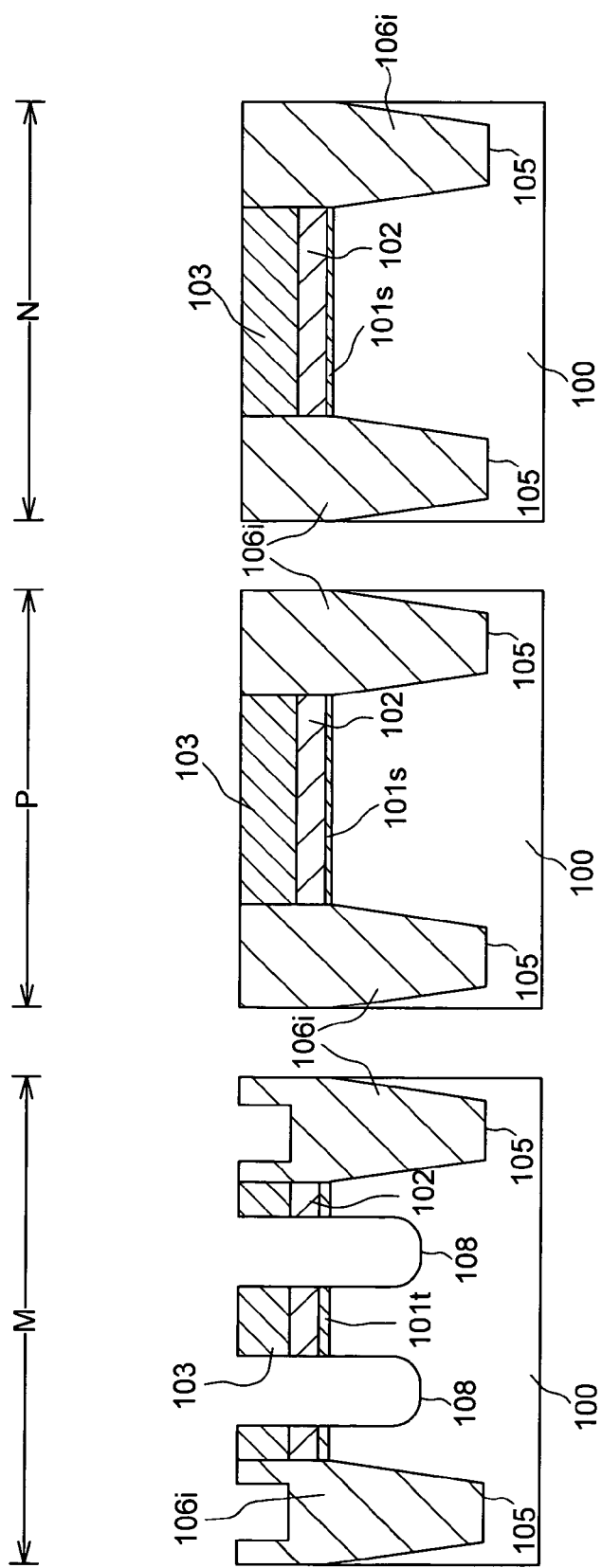
FIG. 9 is a process diagram showing a process of forming gate trenches that is a part of the manufacturing method of a semiconductor device according to a preferred embodiment of the present invention.

After the resist pattern 107 is removed, the non-doped amorphous silicon film 102 and the thick oxide film 101t are etched, and the semiconductor substrate 100 is also etched, whereby gate trenches 108 are formed in the semiconductor substrate 100, as shown in FIG. 9. The silicon nitride film 103 that was used as a mask for forming the STI trenches 105 shown in FIG. 4 thus remains without being removed, and is also used as a mask for forming the gate trenches 108, as shown in FIG. 9.

Figure 10:
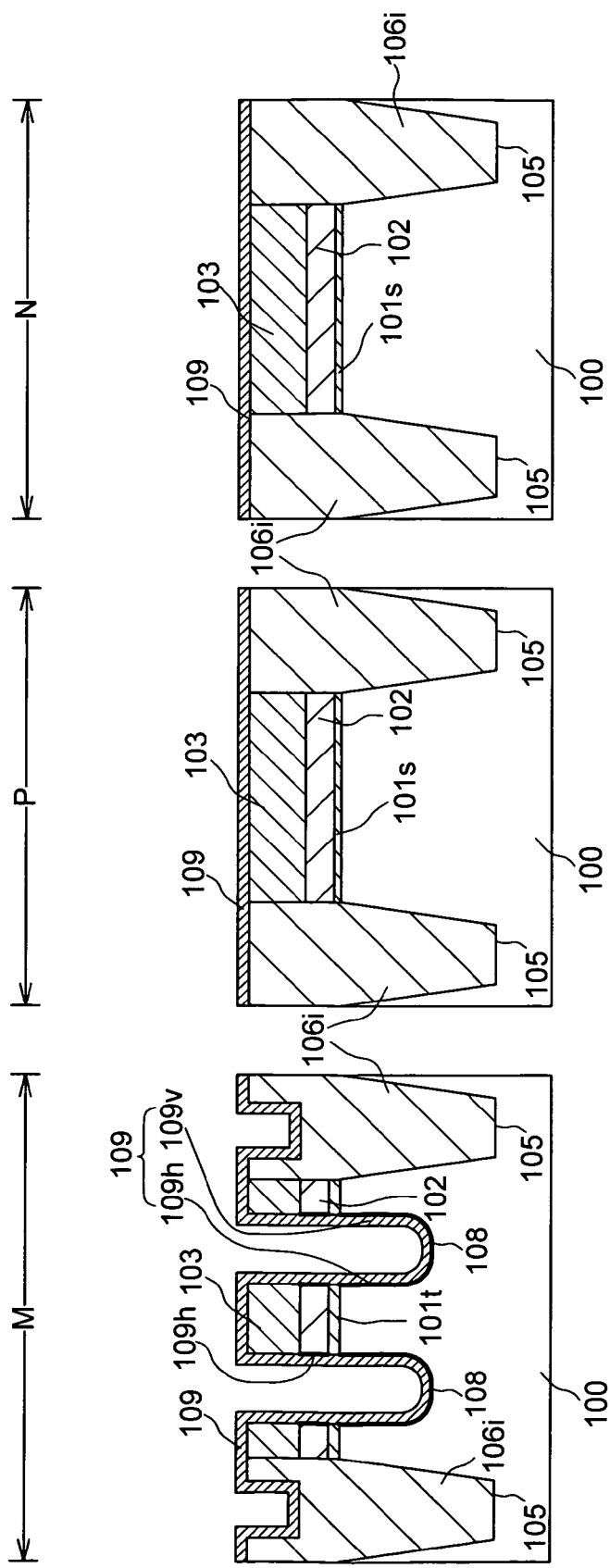
FIG. 10 is a process diagram showing a process of forming a silicon oxide film that is a part of the manufacturing method of a semiconductor device according to a preferred embodiment of the present invention.

Sacrificial oxidation is then performed by thermal oxidation to remove damage and contamination from the etched surfaces inside the gate trenches 108, and the sacrificial oxide film is then removed by wet etching. A silicon oxide film 109 is then formed to act as the gate insulating film of the memory cell transistor, as shown in FIG. 10. This silicon oxide film 109 must also have high voltage resistance as described above, and preferably has a thickness of approximately 4.5 to 7.5 nm.

The silicon oxide film 109 herein is preferably formed by a process in which a CVD oxide film (preferably a HTO (High Temperature Oxide)) having a thickness of approximately 3.5 to 5.5 nm is deposited by a CVD method at a temperature of approximately 800° C., after which the CVD oxide film is thermally oxidized at a temperature of approximately 1050° C. in order to densify the CVD oxide film, remove impurities, and modify the interface between the CVD oxide film and the semiconductor substrate 100. The gate insulating film 109 formed in the gate trenches 108 thereby becomes a layered film that includes a CVD silicon oxide film 109v that is formed by a CVD method, and a thermal oxidation film 109h having a thickness of approximately 1.0 to 2.0 nm that is formed in the interface between the semiconductor substrate 100 and the CVD silicon oxide film 109v. Since the CVD silicon oxide film 109v and the silicon film 102 that is exposed on the inner wall of the gate trench also react in the above-mentioned thermal oxidation, a thermal oxidation film 109h is also formed on the lateral surface of the silicon film 102, as shown in the drawing.

When all the gate insulating films of the memory cell transistor are formed by thermal oxidation, oxidizing species diffuse into the interface between the semiconductor substrate 100 and the element separation regions 106i already formed. The diffused oxidizing species cause the semiconductor substrate 100 to oxidize. As a result, the deposition of the silicon oxide films constituting the element separation regions 106i expands, stress occurs in the semiconductor substrate 100, and the junction characteristics of the DRAM deteriorate. As described above, a CVD silicon oxide film 109v formed by a CVD method is used as the main gate insulating film in the present embodiment, and it is therefore possible to minimize stress and prevent the junction characteristics from deteriorating.

Figure 11:
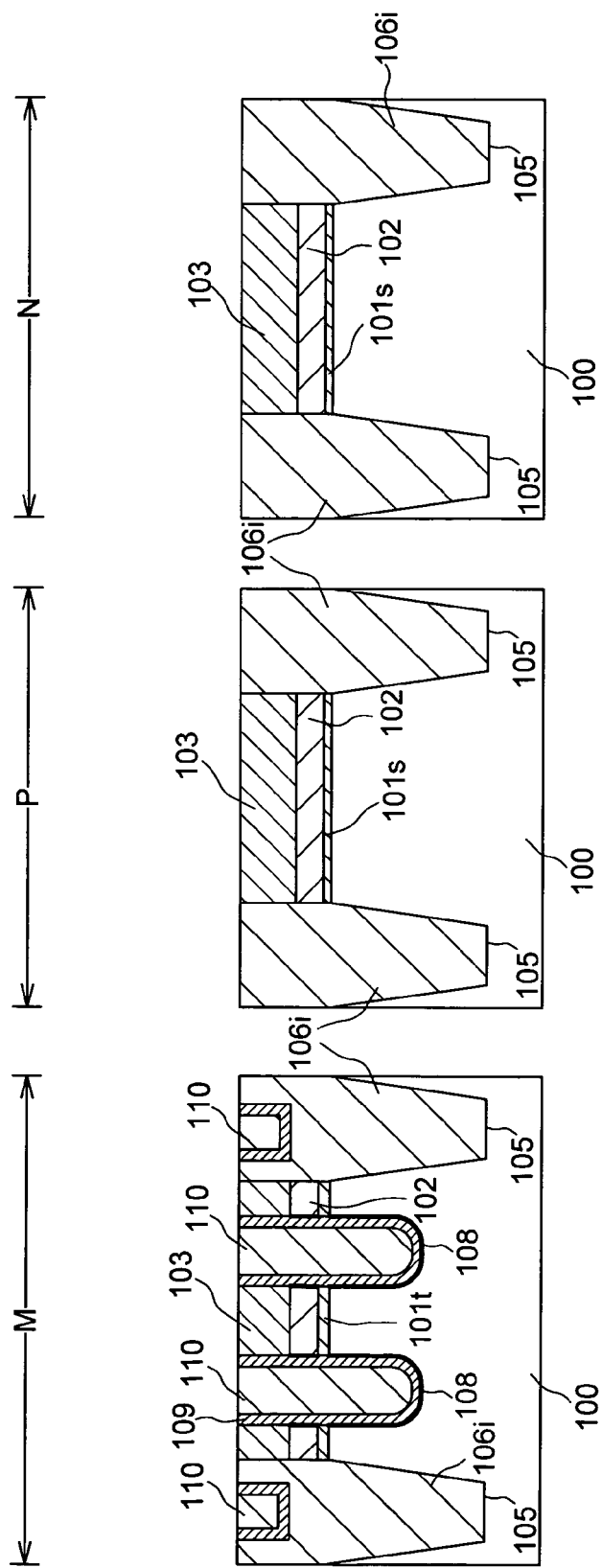
FIG. 11 is a process diagram showing a process of forming phosphorus-doped amorphous silicon films into gate trenches that is a part of the manufacturing method of a semiconductor device according to a preferred embodiment of the present invention.

In order to form the gate electrode of the trench-gate transistor, an amorphous silicon film that is doped with phosphorus as an N-type impurity is then formed on the entire surface that includes the insides of the gate trenches 108. Phosphorus-doped amorphous silicon films 110 are then embedded in the gate trenches 108 as shown in FIG. 11, by performing a planarization process according to a CMP method in which the silicon nitride film 103 is used as a stopper.

Figure 12:
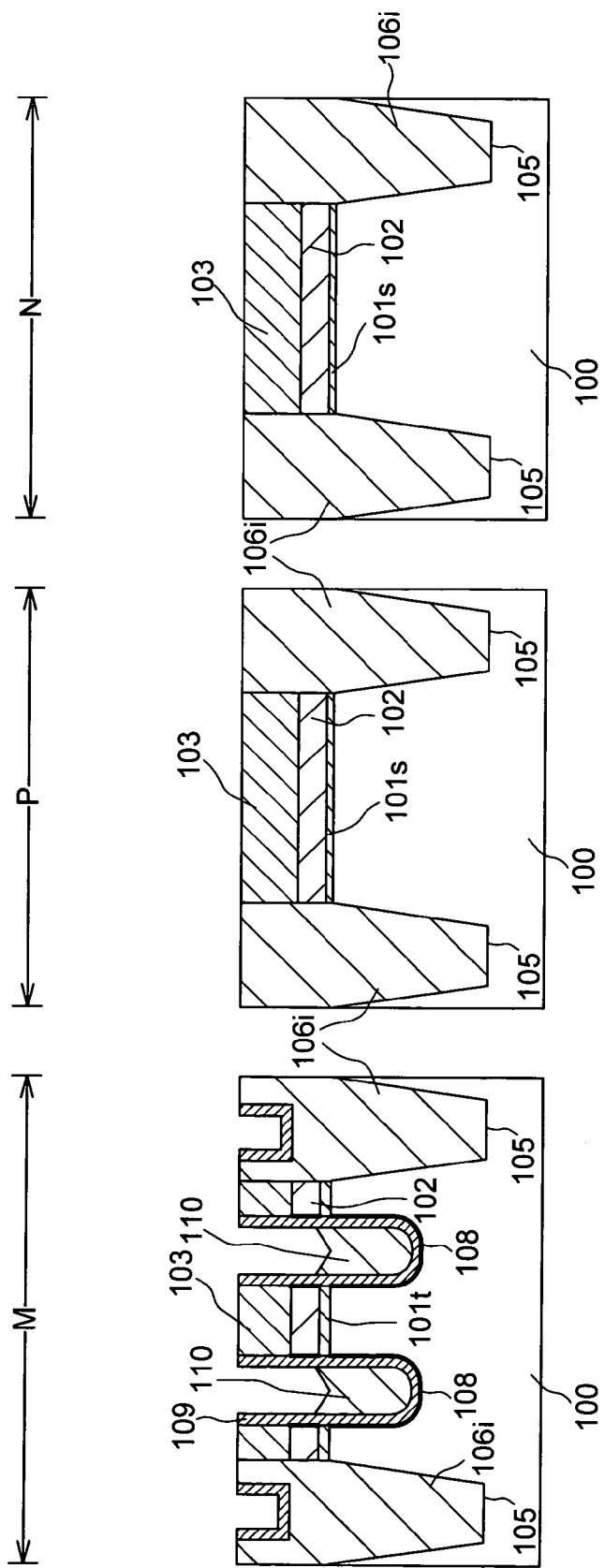
FIG. 12 is a process diagram showing a process of etching-back the phosphorus-doped amorphous silicon films that is a part of the manufacturing method of a semiconductor device according to a preferred embodiment of the present invention.

The phosphorus-doped amorphous silicon films 110 in the gate trenches 108 are then etched back to about the same position as the thick oxide film 101t by dry etching, as shown in FIG. 12.

Figure 13:
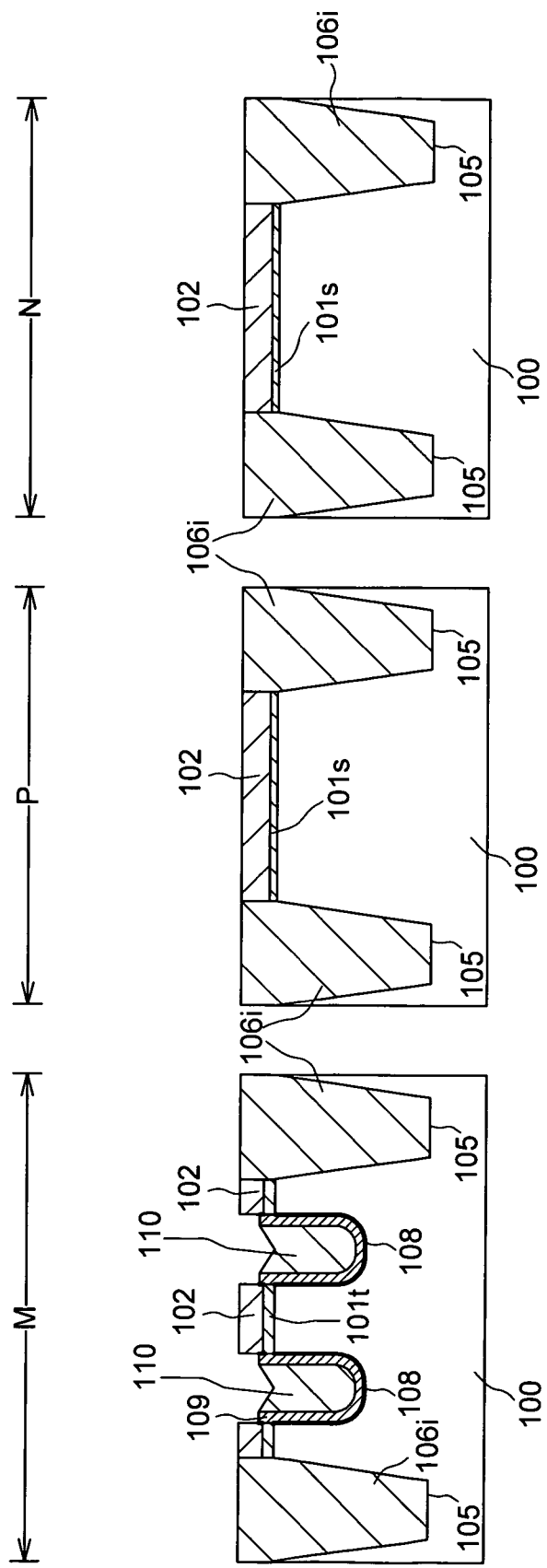
FIG. 13 is a process diagram showing a process of removing the silicon nitride film, the upper portions of the element separation regions, and the upper portions of the silicon oxide films that is a part of the manufacturing method of a semiconductor device according to a preferred embodiment of the present invention.

Wet etching is then performed to remove the silicon nitride film 103, the upper portions of the element separation regions 106i, and the upper portions of the silicon oxide films 109. The upper surfaces of the element separation regions 106i and the protective film (non-doped amorphous silicon film) 102 are thereby aligned with each other, as shown in FIG. 13.

In this manner, an amorphous silicon film 110 that is selectively doped with an impurity can be formed in the gate trenches 108 of region M. Depletion of the trench-gate electrode can thereby be prevented. According to the present embodiment, a non-doped amorphous silicon film 102 is formed on the gate insulating film 101s on regions P and N, and this film functions as a protective film during removal of the silicon nitride film 103 (see FIG. 12) that is used as a mask for forming the gate trenches 108. It is therefore possible to prevent the gate insulating film 101s from being damaged.

Figure 14:
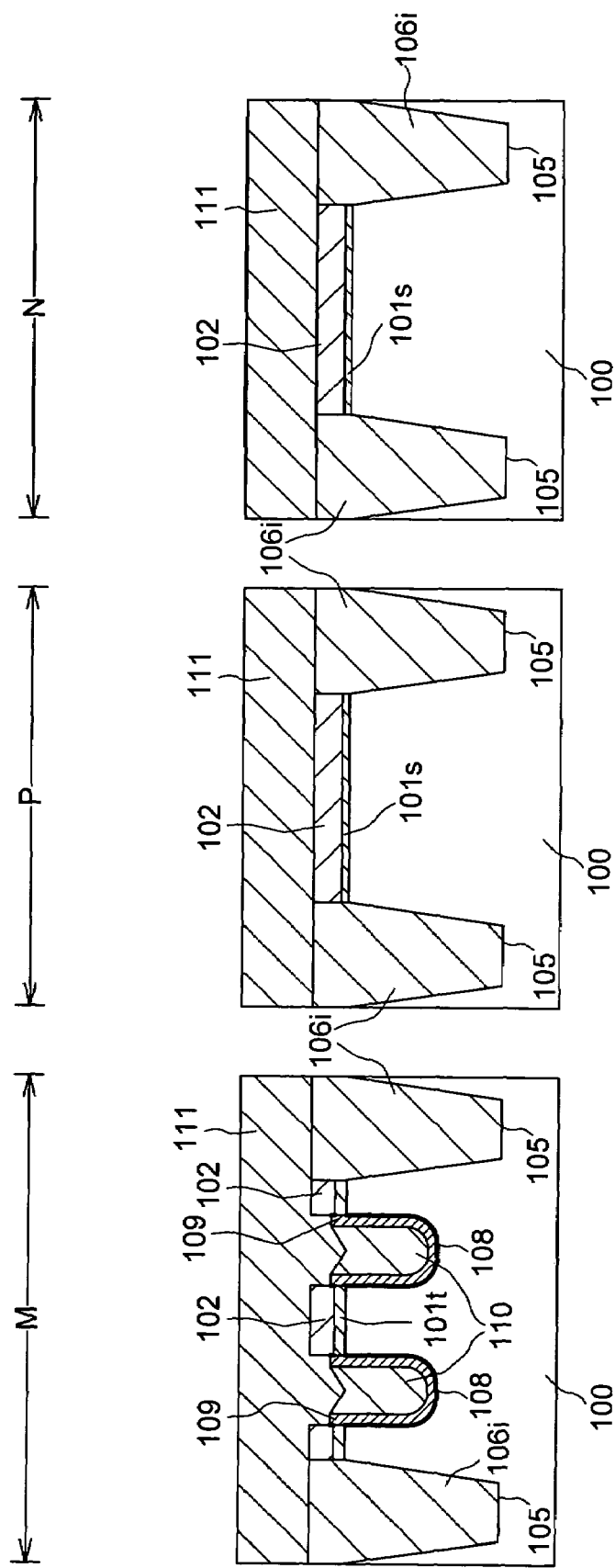
FIG. 14 is a process diagram showing a process of forming a non-doped amorphous silicon film that is a part of the manufacturing method of a semiconductor device according to a preferred embodiment of the present invention.

A CVD method is then used to form a non-doped amorphous silicon film 111 having a thickness of approximately 30 to 80 nm to become the gate electrode of the dual-gate transistor, as shown in FIG. 14.

Figure 15:
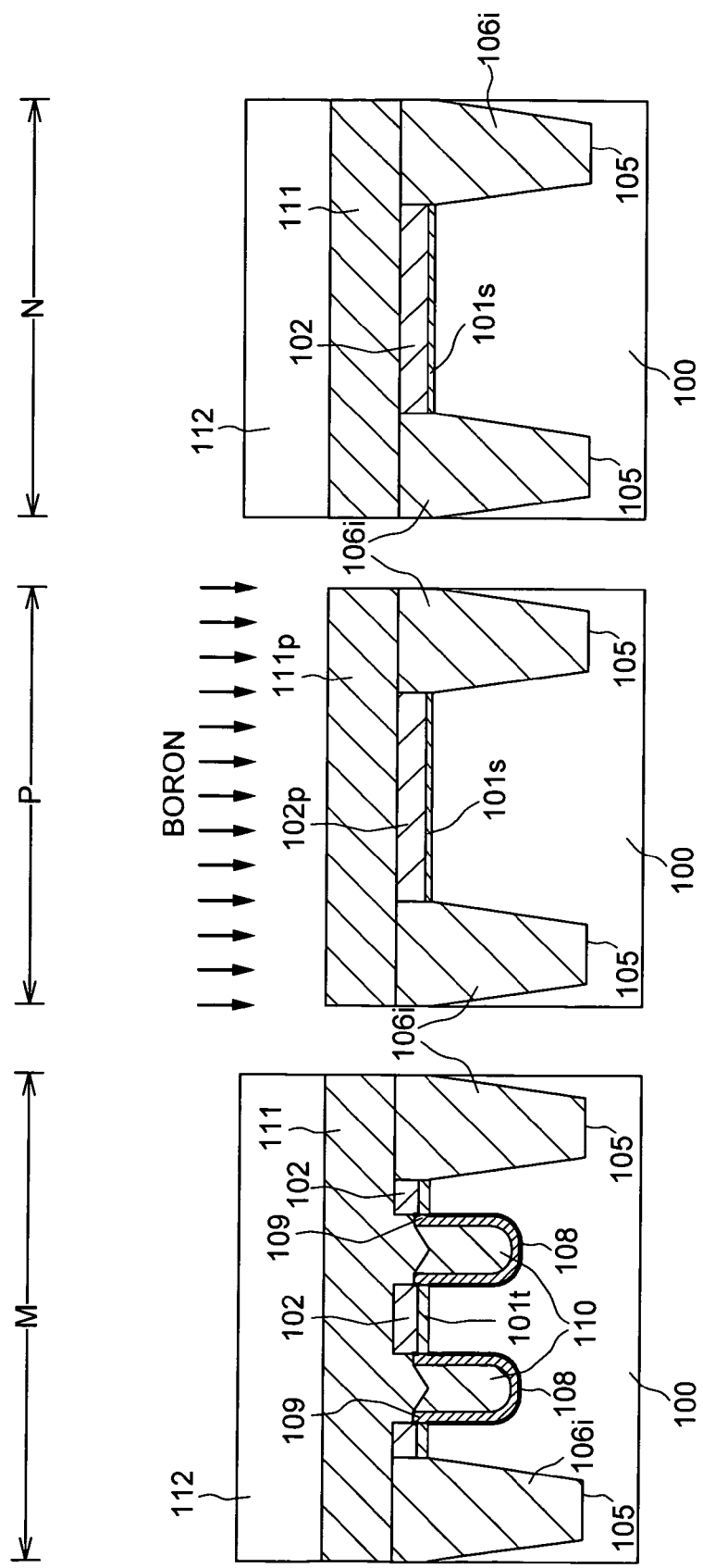
FIG. 15 is a process diagram showing a process of implanting boron ion that is a part of the manufacturing method of a semiconductor device according to a preferred embodiment of the present invention.

As shown in FIG. 15, regions M and N are then masked by a resist pattern 112, and boron (B) as a P-type impurity is ion-implanted into region P. This ion implantation of boron is performed at a low energy of 10 keV or less. The implanted boron ions are diffused in a subsequently performed heat treatment, whereby the non-doped amorphous silicon films 111 and 102 (see FIG. 14) of region P become P-type amorphous silicon films 111p and 102p.

Figure 16:
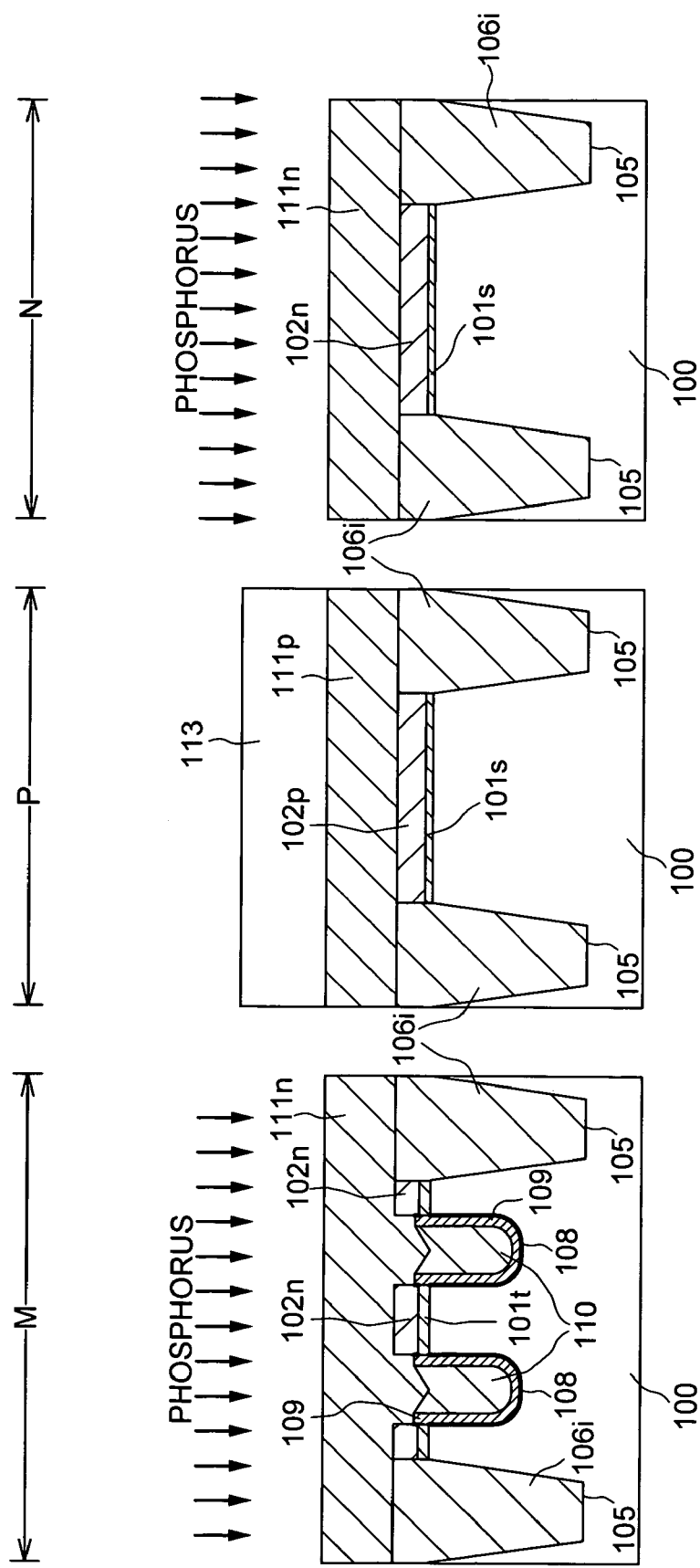
FIG. 16 is a process diagram showing a process of implanting phosphorus ion that is a part of the manufacturing method of a semiconductor device according to a preferred embodiment of the present invention.

After the resist pattern 112 is removed, region P in this instance is masked by a resist pattern 113, and phosphorus (P) as an N-type impurity is ion-implanted into regions M and N, as shown in FIG. 16. This ion implantation of phosphorus is also performed at a low energy of 20 keV or less, the same as the ion implantation of boron described above, and the phosphorus ions are diffused by a subsequent heat treatment. The non-doped amorphous silicon films 111 and 102 (see FIG. 15) of region N thereby become N-type amorphous silicon films 111n and 102n. The non-doped amorphous silicon films 111 and 102 of region M are also made into N-type amorphous silicon films 111n and 102n by this ion implantation.

According to the present embodiment, phosphorus-doped silicon films 110 are already embedded in the gate trenches 108 of region M. Ion implantation can therefore be performed under suitable implantation conditions according to the thickness of the silicon film 111 (and the silicon film 102 that is the protective film) without regard to implantation into the gate trenches 108 when ion implantation into region M is performed at the same time as phosphorus is implanted into region N in the ion implantation process for creating P-type and N-type non-doped silicon films 111, which are the gate electrodes of the dual-gate transistor.

Figure 17:
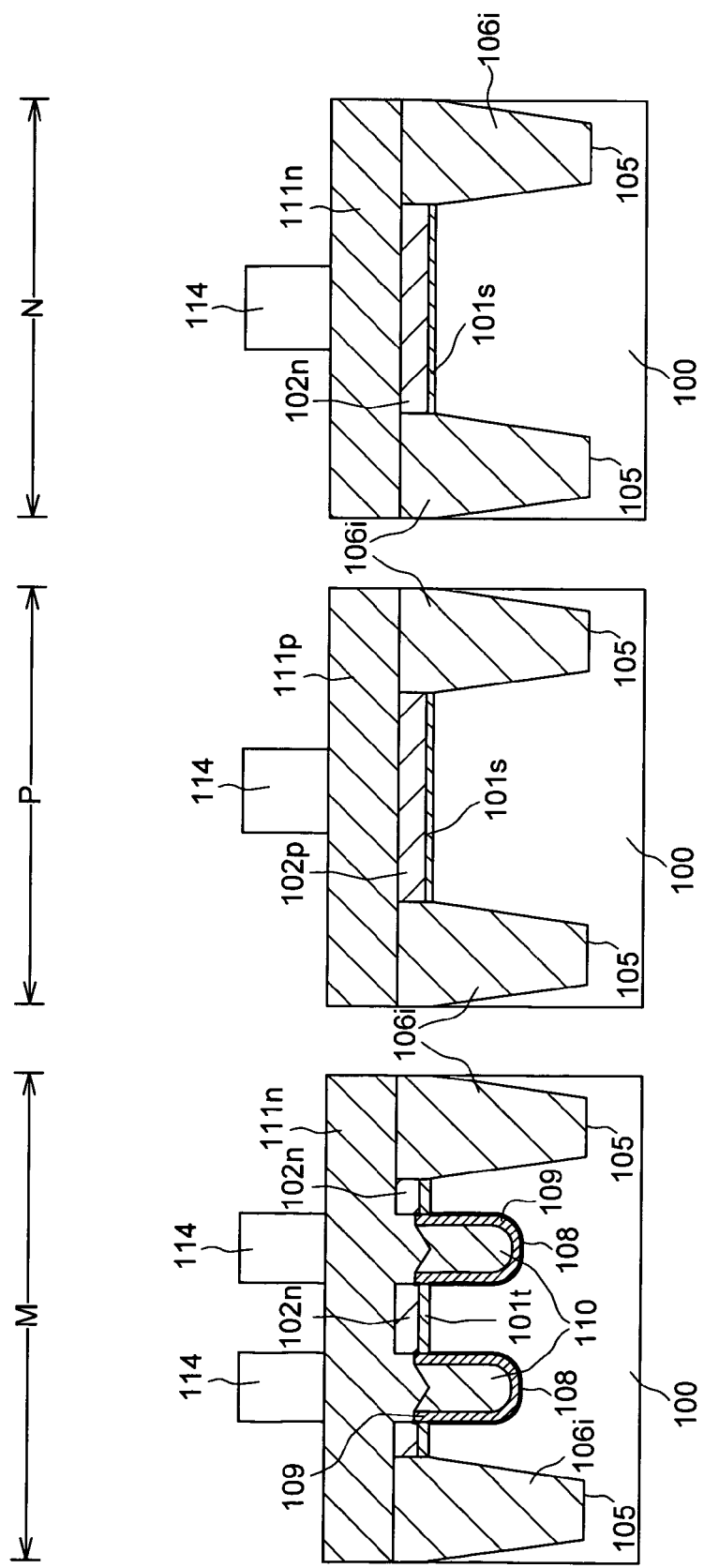
FIG. 17 is a process diagram showing a process of forming resist patterns that is a part of the manufacturing method of a semiconductor device according to a preferred embodiment of the present invention.

Resist patterns 114 for use in forming gate electrodes are then formed on the impurity-doped amorphous silicon films 111n and 111p, as shown in FIG. 17.

Figure 18:
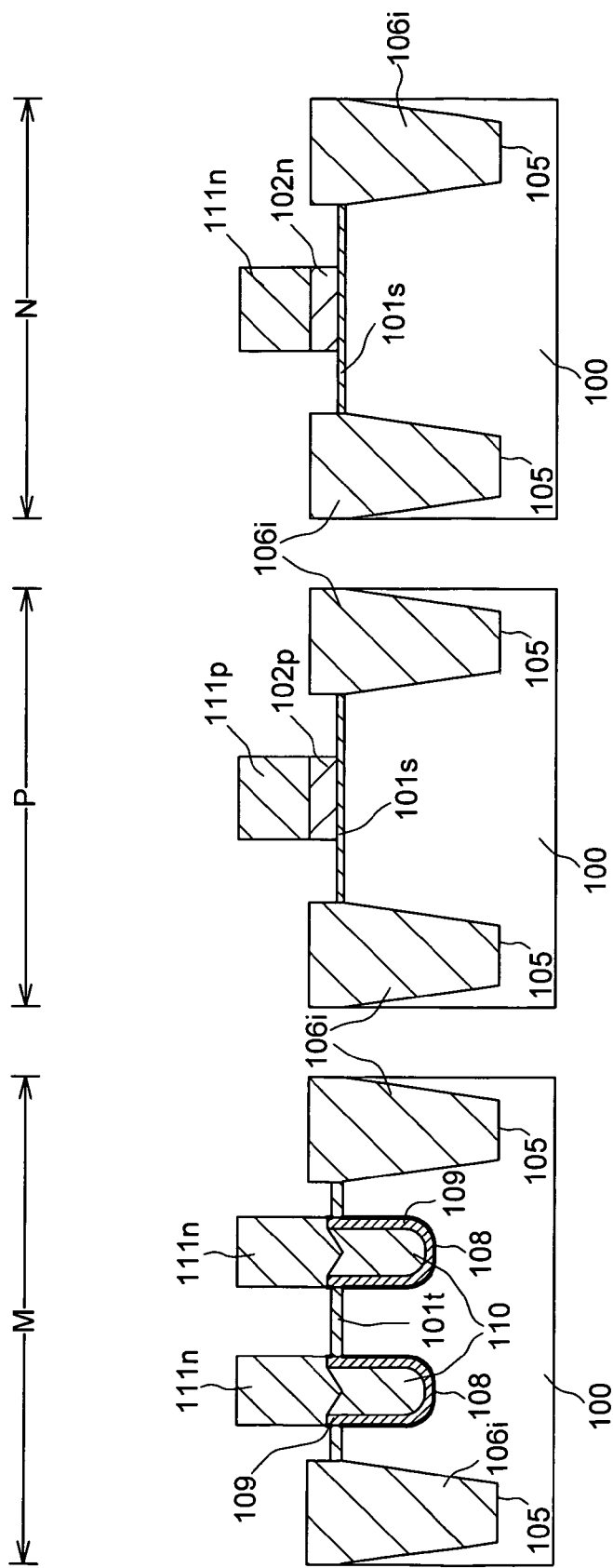
FIG. 18 is a process diagram showing a process of patterning layered films that is a part of the manufacturing method of a semiconductor device according to a preferred embodiment of the present invention.

As shown in FIG. 18, the layered film that includes the amorphous silicon films 111p and 102p, as well as the layered film that includes the amorphous silicon films 111n and 102n, are then each patterned using the resist pattern 114 as a mask. A gate electrode of a trench-gate transistor composed of doped amorphous silicon films 110 and 111n is thereby formed in region M, a P-type gate electrode composed of doped amorphous silicon films 111p and 102p is formed in region P, and an N-type gate electrode composed of doped amorphous silicon films 111n and 102n is formed in region N.

The example described herein is of a case in which the patterned amorphous silicon films 111n are not misaligned with respect to the gate trenches 108 in region M. However, when misalignment does occur, amorphous silicon films 111n and amorphous silicon films 102 remain on the thick oxide film 101t and become portions of a gate electrode. In this type of case, the thick oxide film 101t functions as a portion of the gate insulating film in this trench-gate transistor. However, since the oxide film 101t is formed so as to have about the same thickness as the silicon oxide films 109 in the gate trenches 108, a reduction in the breakdown voltage thereof can be minimized.

Figure 19:
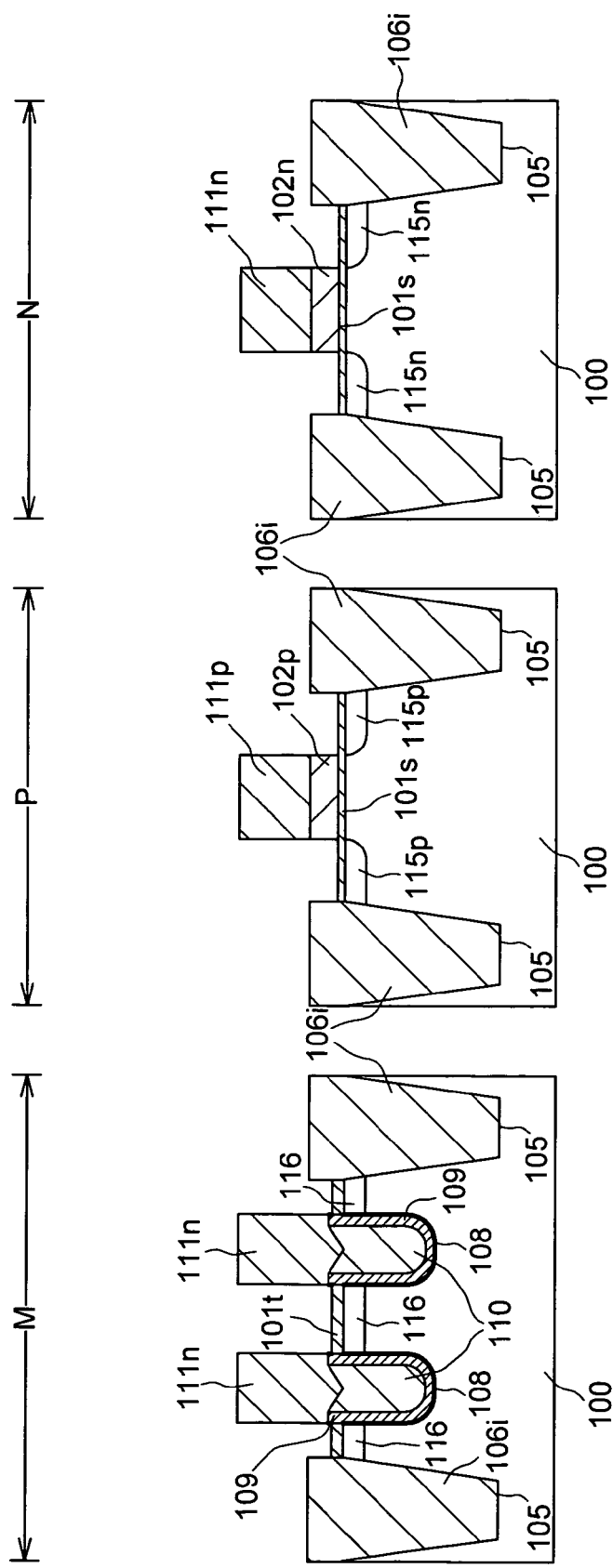
FIG. 19 is a process diagram showing a process of forming source/drain diffusion regions that is a part of the manufacturing method of a semiconductor device according to a preferred embodiment of the present invention.

As shown in FIG. 19, regions M and N are then covered by a resist film (not shown), and P-type source/drain diffusion regions 115p are formed by ion-implanting a P-type impurity into region P using the P-type gate electrode as a mask. Region P is then covered by a resist film (not shown), and an N-type impurity is ion-implanted into regions M and N using the gate electrodes of regions M and N as masks. N-type source/drain diffusion regions 115n are thereby formed in region N, and N-type source/drain diffusion regions 116 are formed in region M. According to this process, a trench-gate memory cell transistor is formed in region M, and a dual-gate transistor is formed in regions P and N, which are peripheral circuit regions.

The amorphous silicon films 111n, 111p, 102p, 102n, and 110 are converted from amorphous silicon films to polycrystalline silicon films by the heat treatment performed to activate the source/drain diffusion regions, or by a subsequent heating process.

Figure 20:
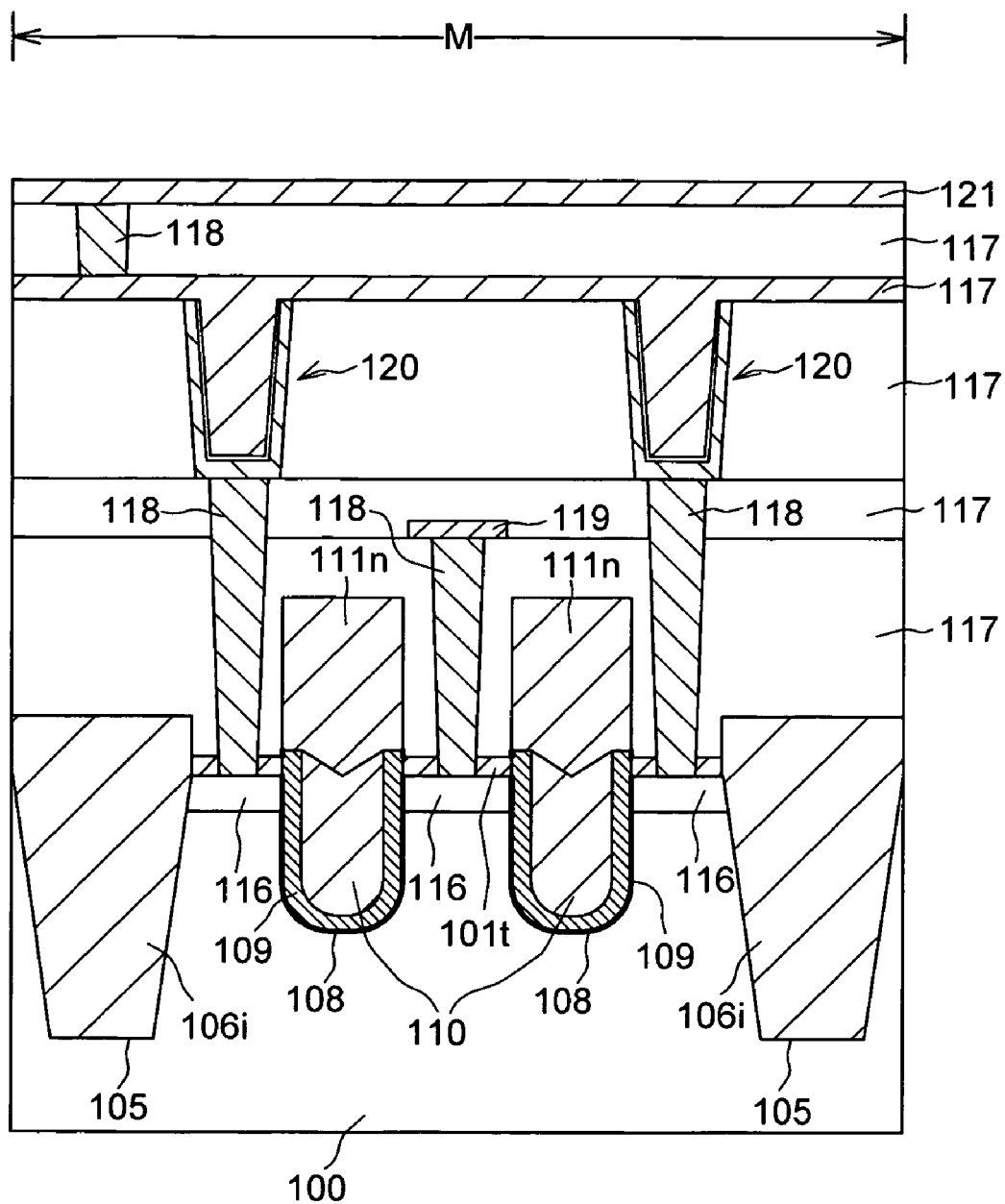
FIG. 20 is a process diagram showing a process of forming various wiring patterns and cell capacitors that is a part of the manufacturing method of a semiconductor device according to a preferred embodiment of the present invention.
Figure 21:
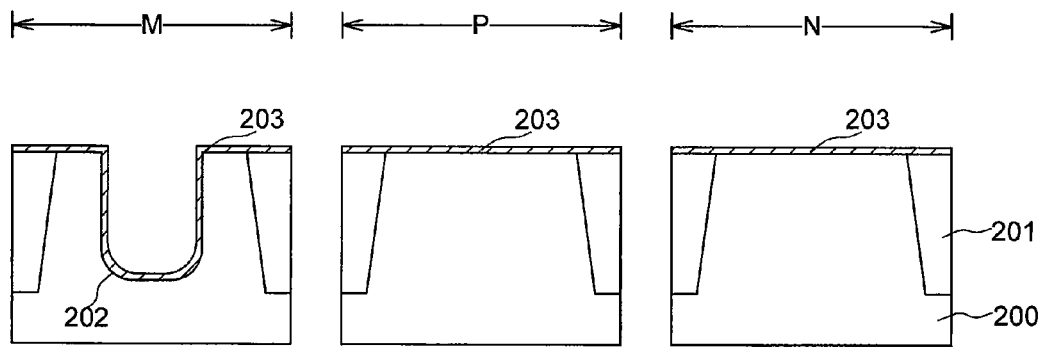
FIG. 21 is a process diagram showing a process of forming an STI, a gate trench, and a gate insulating film that is a part of a first conventional method.
Figure 22:
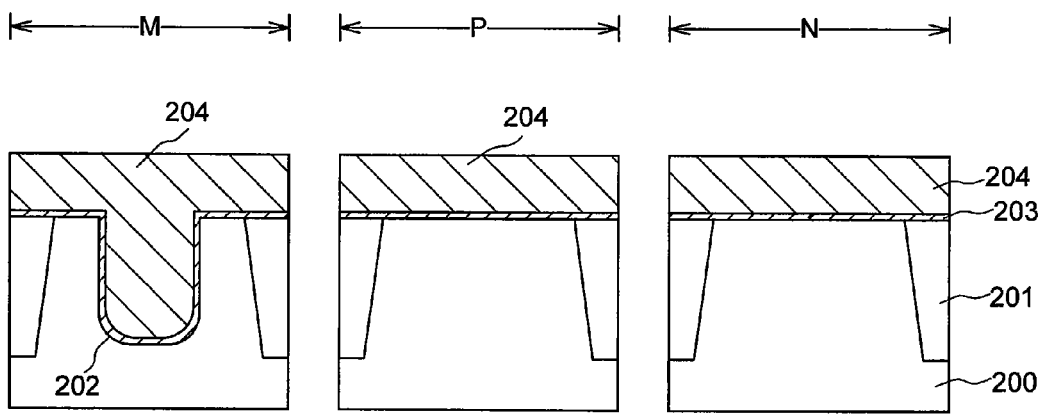
FIG. 22 is a process diagram showing a process of forming a non-doped silicon film that is a part of the first conventional method.
Figure 23:
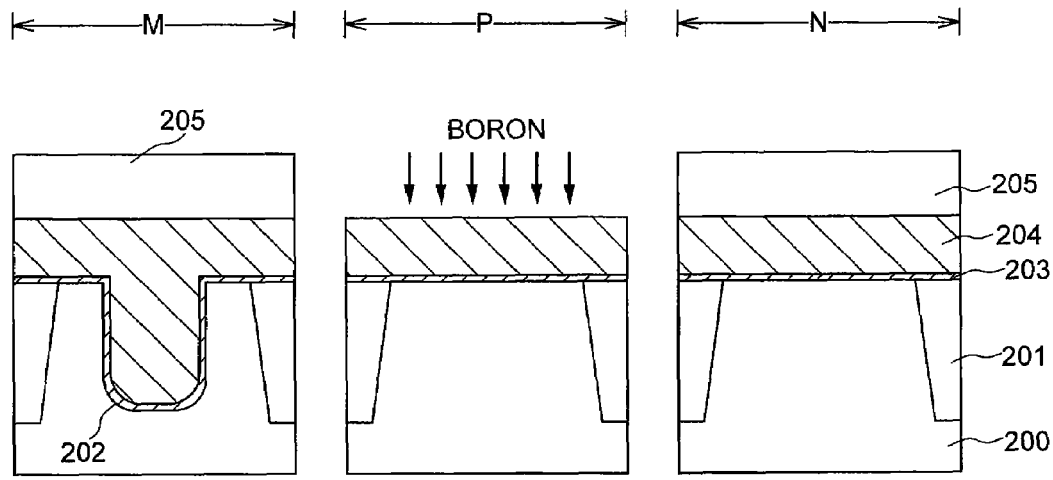
FIG. 23 is a process diagram showing a process of implanting boron ion that is a part of the first conventional method.
Figure 24:
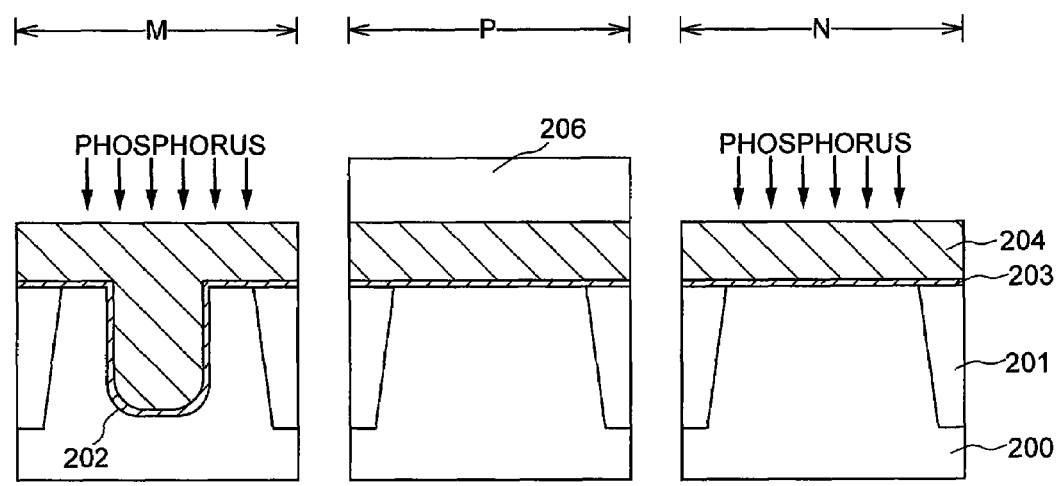
FIG. 24 is a process diagram showing a process of implanting phosphorus ion that is a part of the first conventional method.
Figure 25:
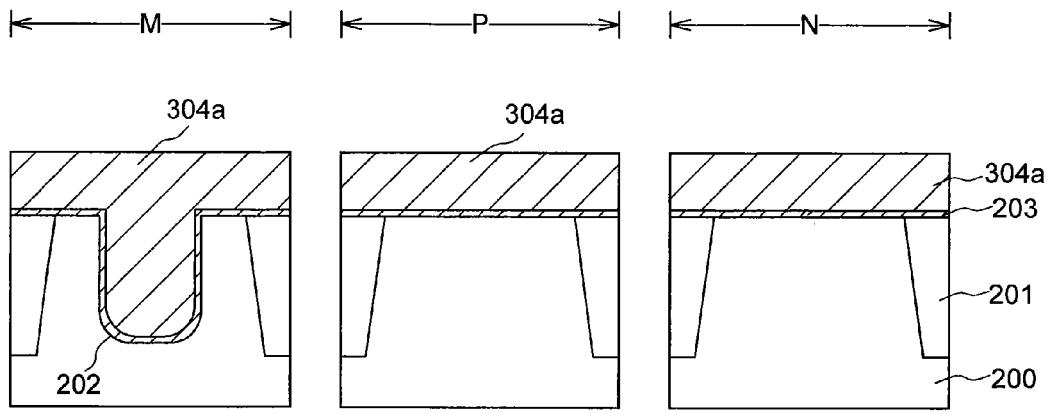
FIG. 25 is a process diagram showing a process of forming a doped silicon film that is a part of a second conventional method.
Figure 26:
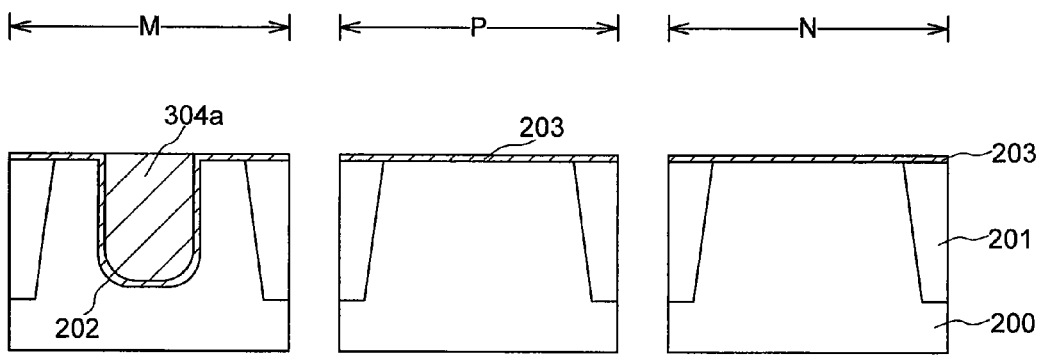
FIG. 26 is a process diagram showing a process of etching back the doped silicon film that is a part of the second conventional method.
Figure 27:
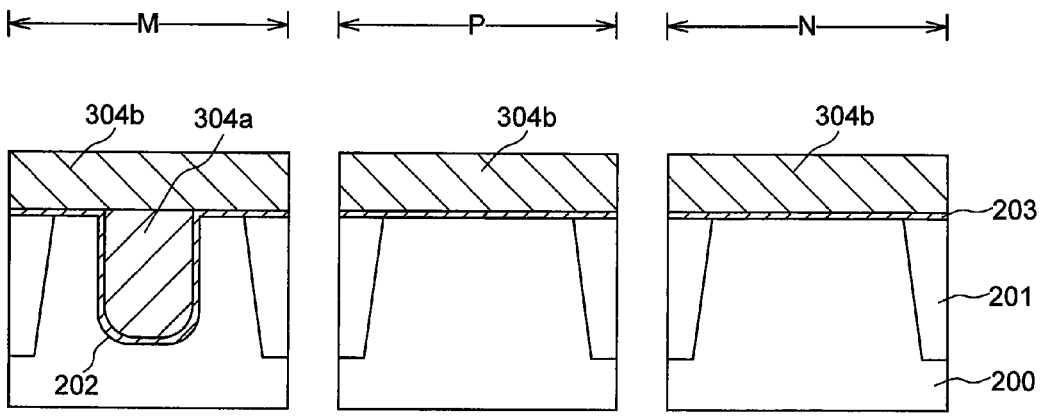
FIG. 27 is a process diagram showing a process of forming a non-doped silicon film that is a part of the second conventional method.

Various types of wiring or cell capacitors are then layered in region M using a common method. Specifically, DRAM having a trench-gate memory cell transistor is formed by a process in which an interlayer insulating film 117 is formed on the memory cell transistor, and a contact plug 118 that pass through the interlayer insulating film 117, a bit line 119, a cell capacitor 120, Al wiring 121, and other components are formed, as shown in FIG. 20.

According to the present embodiment as described above, the protective film 102 is provided in advance on the gate insulating film (thin oxide film) 101s under the silicon nitride film 103, which is the mask layer for forming the gate trenches 108, and the gate trenches 108 are formed in the P-type peripheral circuit region and the N-type peripheral circuit region. An impurity-doped amorphous silicon film 110 is then formed in the gate trenches 108 without removing the mask layer 103, and the mask layer 103 used to form the gate trenches 108 is then removed. Since the mask layer 103 is thus removed after the doped amorphous silicon film 110 is embedded and formed in the gate trenches 108, damage to the gate insulating film 101s can be prevented by the protective film that was provided in advance. Accordingly, it is possible to form an impurity-doped amorphous silicon film 110 in the gate trenches 108, and to form a non-doped amorphous silicon film 111 on the P-type peripheral circuit region, the N-type peripheral circuit region, and the doped amorphous silicon film 110 that was embedded in the gate trenches. The silicon films 110, 111, and 102 can thereby be formed in the appropriate impurity concentrations without damaging the thin oxide film 101s, and the trench-gate transistor and the dual-gate-structured transistor can both be endowed with high performance.

The present invention is in no way limited to the aforementioned embodiments, but rather various modifications are possible within the scope of the invention as recited in the claims, and naturally these modifications are included within the scope of the invention.

For example, a non-doped amorphous silicon film was used as the protective film 102 in the embodiment described above. However, this configuration is not limiting, and another material may also be used insofar as the material is capable of protecting the gate insulating film from being damaged when the mask layer is removed, and of forming a film that does not impede the operation of the transistors. Specifically, another material may be used insofar as it forms a film (conductive thin film or the like) whereby it is possible to form a channel needed during the application of voltage to a gate electrode.

In the abovementioned embodiment, an example was described in which each silicon film was first formed in an amorphous state and then converted to a polycrystalline silicon film by a subsequent heating process. However, polycrystalline silicon films may also be used initially as needed.

Figure 28:
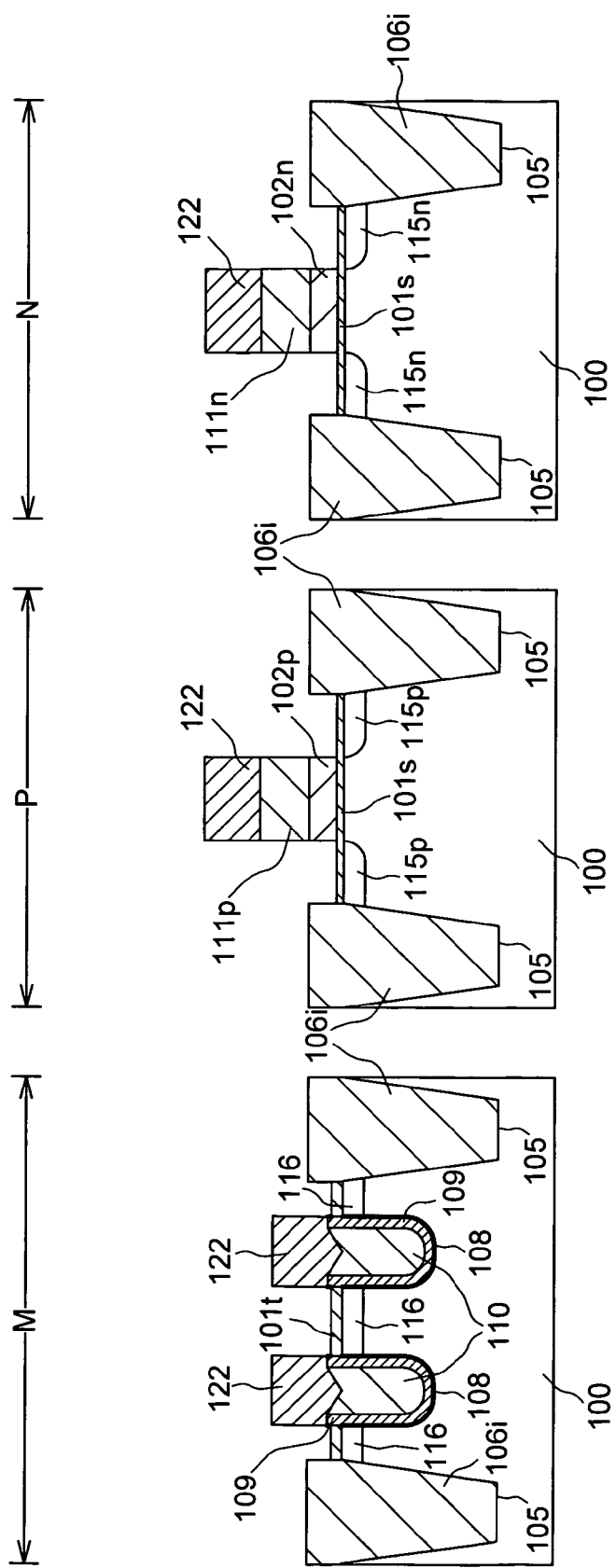
FIG. 28 is a sectional view showing a modified example of the semiconductor device according to a preferred embodiment of the present invention.

The gate electrode is also not necessarily formed using only silicon films, and it is also possible to form a silicide layer on a silicon film, or to create a so-called polymetal gate electrode by layering metal films. FIG. 28 shows an example in which the gate electrode is a polymetal gate electrode, and corresponds to the process shown in FIG. 19 in the above-mentioned embodiment. As shown in FIG. 28, a metal film 122 is layered on a silicon film 110 in region M, and a metal-film 122 is layered on each silicon film 111p and 111n in regions P and N, respectively. When the gate electrodes are thus composed of polymetal gate electrodes, it is necessary to perform ion implantation for the silicon films 111 of regions P and N in order to convert the silicon film 111 of region P into a P-type silicon film 111p and to convert the silicon film 111 of region N into an N-type silicon film 111n prior to forming the metal films 122.

Furthermore, the example described above was one in which the mask layer for forming the trenches 105 that were used for STI, and the mask layer for forming the gate trenches 108 were used in common in the silicon nitride film 103. However, the silicon nitride film 103 may be removed after the STI (element separation regions) 106i are formed, and a new silicon nitride film may be created to form a mask layer.

What is claimed is:

1. A method of manufacturing a semiconductor device, comprising:
   covering second and third portions of a semiconductor layer with first and second stack structures, respectively, the first stack structure including a first gate insulating film and a first gate electrode material layer on the first gate insulating film, and the second stack structure including a second gate insulating film and a second gate electrode material layer on the second gate insulating film;
   selectively forming a trench in a first portion of the semiconductor layer after said covering the second and third portions;
   forming a third gate electrode material layer in the trench with an intervention of a third gate insulating film therebetween while covering the second and third portions of the semiconductor layer respectively with first and second stack structures;
   forming a fourth gate electrode material layer in contact respectively with the first, second and third gate electrode materials; and
   selectively removing the first, second and fourth gate electrode material layers to form first, second and third gate electrodes respectively on the first, second and third portions of the semiconductor layer, the first gate electrode comprising the third gate electrode material layer and a first part of the fourth gate electrode material layer, the second gate electrode comprising a part of the first gate electrode material layer and a second part of the fourth gate electrode material layer, and the third gate electrode comprising a part of the second gate electrode material layer and a third part of the fourth gate electrode material layer.

2. The method as claimed in claim 1, wherein each of the first, second, third and fourth gate electrode material layers comprises a silicon layer.

3. The method as claimed in claim 1, wherein the third gate electrode material layer is doped with an impurity before the forming a fourth gate electrode material layer, and the first and second gate electrode material layers and the first, second and third parts of the fourth gate electrode material layers are doped with respective impurities before the selectively removing.

4. The method as claimed in claim 3, wherein each of the impurities doped respectively in the third gate electrode material layer, the first gate electrode material layer and the first and second parts of the fourth gate electrode material layer represents one conductivity type and each of the impurities doped in the second gate electrode material layer and the third part of the fourth gate electrode material layer represent the other conductive type.

5. The method as claimed in claim 1, wherein the third gate electrode material layer is doped with an impurity indicative of one conductivity type before the forming a fourth gate electrode material layer, and wherein the first and second parts of the fourth gate electrode material layer and the first gate electrode material layer being doped with an impurity indicative of the one conductivity type simultaneously with one another and the third part of the fourth gate electrode material layer and the second gate electrode material layer are doped with an impurity indicative of the other conductivity type simultaneously with each other.

6. The method as claimed in claim 5, wherein the one conductivity type is N type and the other conductive type is P type.

7. The method as claimed in claim 1, wherein the first stack structure further includes a first insulating layer on the first gate electrode material layer, and the second stack structure further includes a second insulating layer on the second gate electrode material layer, the method further comprising removing the first and second insulating layers after the forming a third gate electrode material layer and before the forming a fourth gate electrode material layer.

* * * * *